United States Patent
Tanaka et al.

(10) Patent No.: US 8,253,187 B2
(45) Date of Patent: Aug. 28, 2012

(54) NON-VOLATILE SEMICONDUCTOR STORAGE DEVICE AND METHOD OF MANUFACTURING THE SAME

(75) Inventors: Hiroyasu Tanaka, Tokyo (JP); Ryota Katsumata, Yokohama (JP); Masaru Kito, Yokohama (JP); Yoshiaki Fukuzumi, Yokohama (JP); Masaru Kido, Komae (JP); Hideaki Aochi, Kawasaki (JP); Mitsuru Sato, Yokohama (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 738 days.

(21) Appl. No.: 12/142,289

(22) Filed: Jun. 19, 2008

(65) Prior Publication Data

US 2008/0315296 A1 Dec. 25, 2008

(30) Foreign Application Priority Data

Jun. 20, 2007 (JP) ................................. 2007-163085

(51) Int. Cl.
*H01L 27/115* (2006.01)
(52) U.S. Cl. ........ 257/319; 257/314; 257/325; 257/326; 257/E21.679; 257/E29.126
(58) Field of Classification Search .................. 257/314, 257/325–326, E21.679, 29.129, 319
See application file for complete search history.

(56) References Cited

U.S. PATENT DOCUMENTS

| 6,870,215 B2 | 3/2005 | Endoh et al. |
| 2008/0067583 A1 | 3/2008 | Kidoh et al. |
| 2008/0099819 A1* | 5/2008 | Kito et al. ..................... 257/315 |

OTHER PUBLICATIONS

U.S. Appl. No. 11/896,261, filed Aug. 30, 2007, Ryota Katsumata.
U.S. Appl. No. 11/962,862, filed Dec. 21, 2007, Hiroyasu Tanaka et al.

* cited by examiner

*Primary Examiner* — Minchul Yang
(74) *Attorney, Agent, or Firm* — Oblon, Spivak, McClelland, Maier & Neustadt, L.L.P.

(57) ABSTRACT

A non-volatile semiconductor storage device 10 has a plurality of memory strings 100 with a plurality of electrically rewritable memory transistors MTr1-MTr4 connected in series. The memory string 100 includes a columnar semiconductor CLmn extending in a direction perpendicular to a substrate, a plurality of charge accumulation layers formed around the columnar semiconductor CLmn via insulating films, and selection gate lines on the drain side SGD contacting the columnar semiconductor to configure transistors. The selection gate lines on the drain side SGD have lower selection gate lines on the drain side SGDd, each of which is arranged with an interval with a certain pitch, and upper selection gate lines on the drain side SGDu located on a higher layer than the lower selection gate lines on the drain side SGDd, each of which is arranged on gaps between the lower selection gate lines on the drain side SGDd.

6 Claims, 24 Drawing Sheets

Columnar semiconductor CLmn
in the memory transistor MTrmn area

Columnar semiconductor CLmn
in the memory transistor MTrmn area

Columnar semiconductor CLmn
in the memory transistor MTrmn area

Columnar semiconductor CLmn
in the memory transistor MTrmn area

NON-VOLATILE SEMICONDUCTOR STORAGE DEVICE AND METHOD OF MANUFACTURING THE SAME

CROSS REFERENCE TO RELATED APPLICATIONS

This application is based on and claims the benefit of priority from prior Japanese Patent Application No. 2007-163085, filed on Jun. 20, 2007, the entire contents of which are incorporated herein by reference.

BACKGROUND OF THE INVENTION

1. Field of the Invention

The present invention relates to electrically rewritable semiconductor storage devices and methods of manufacturing the same, and in particular to a non-volatile semiconductor storage device among semiconductor storage devices, and a method of manufacturing the same.

2. Description of the Related Art

As demand for small and large capacity non-volatile semiconductor storage devices has grown, NAND-type flash memories have attracted increasing attention because of their potential improvements in integration density and capacity.

To improve integration density and capacity of such NAND-type flash memories, it is necessary to reduce their design rules. Reducing the design rules requires further refinement in wiring patterns. Since further refinement in wiring patterns requires very sophisticated processing technology, it is difficult to reduce the design rules.

Therefore, recently a large number of semiconductor storage devices have been proposed where memory cells are arranged in a three-dimensional manner to achieve improved integration of memory devices (see, Japanese Patent Laid-Open No. 2003-078044, U.S. Pat. Nos. 5,599,724 and 5,707,885).

One of the conventional semiconductor storage devices where memory cells are arranged in a three-dimensional manner uses transistors with a SGT (columnar-type) structure (see, Japanese Patent Laid-Open No. 2003-078044, U.S. Pat. Nos. 5,599,724 and 5,707,885). This semiconductor storage device using transistors with a SGT (columnar-type) structure includes multiple layers of polysilicon corresponding to gate electrodes and pillar-like columnar semiconductors that are formed to penetrate the multiple layers of polysilicon. The columnar semiconductor serves as a channel (body) part of the transistor. The configuration including these gate electrodes and columnar semiconductor is referred to as memory string.

In addition, in the SGT (columnar-type) structure, to select one columnar semiconductor, selection gate lines that extend in a direction perpendicular to the longitudinal direction of columnar semiconductors are connected to the upper and lower portions of the columnar semiconductors. Each of the selection gate lines is formed in such a way that a corresponding columnar semiconductor fits in its width direction. In addition, each of the selection gate lines is arranged to be spaced apart from the adjacent selection gate lines by a certain distance while being insulated therefrom. Further, bit lines that extend in a direction perpendicular to the longitudinal direction of the selection gate lines and the columnar semiconductors are provided above the selection gate lines above the columnar semiconductors. Each intersection between a bit line and a selection gate line is formed to be located on the upper end of the corresponding columnar semiconductor.

In this case, for example, consider the minimum line width of lithography is "F". If the columnar semiconductor has a diameter (width) of "F", then selection gate line formed in such a way that the corresponding columnar semiconductor fits in its width direction has a width of "2 F" and may be formed with a space of "F" (in total, "3 F"). On the other hand, the bit line has a width of "F" and may be formed with a space of "F" (in total, "2 F"). That is, one channel part configured by a columnar semiconductor occupies "6 $F^2$" (2 F×3 F). However, there is a need for a greater reduction in the occupation area.

SUMMARY OF THE INVENTION

One aspect of the present invention provides a non-volatile semiconductor storage device comprising a plurality of memory strings with a plurality of electrically rewritable memory cells connected in series, the memory string including a columnar semiconductor extending in a direction perpendicular to a substrate, a plurality of charge accumulation layers formed around the columnar semiconductor via insulating films, and conductive layers contacting the columnar semiconductor to configure transistors, wherein the conductive layers comprising: first conductive layers, each arranged with an interval with a certain pitch; and second conductive layers located on a higher layer than the first conductive layers, each arranged on a first interlayer insulating film residing on a gap between the first conductive layers.

In addition, another aspect of the present invention provides a method of manufacturing a non-volatile semiconductor storage device having a plurality of memory strings with a plurality of electrically rewritable memory cells connected in series, the memory string including a columnar semiconductor extending in a direction perpendicular to a substrate, a plurality of charge accumulation layers formed around the columnar semiconductor via insulating films, and first and second conductive layers contacting the columnar semiconductor to configure transistors, the method comprising: forming the first conductive layers, each with an interval with a certain pitch, and forming the second conductive layers on a higher layer than the first conductive layers to be arranged on gaps between the first conductive layers.

DETAILED DESCRIPTION OF THE EMBODIMENTS

Embodiments of a non-volatile semiconductor storage device according to the present invention will now be described below with reference to the accompanying drawings.

First Embodiment

Configuration of First Embodiment

Figure 1:
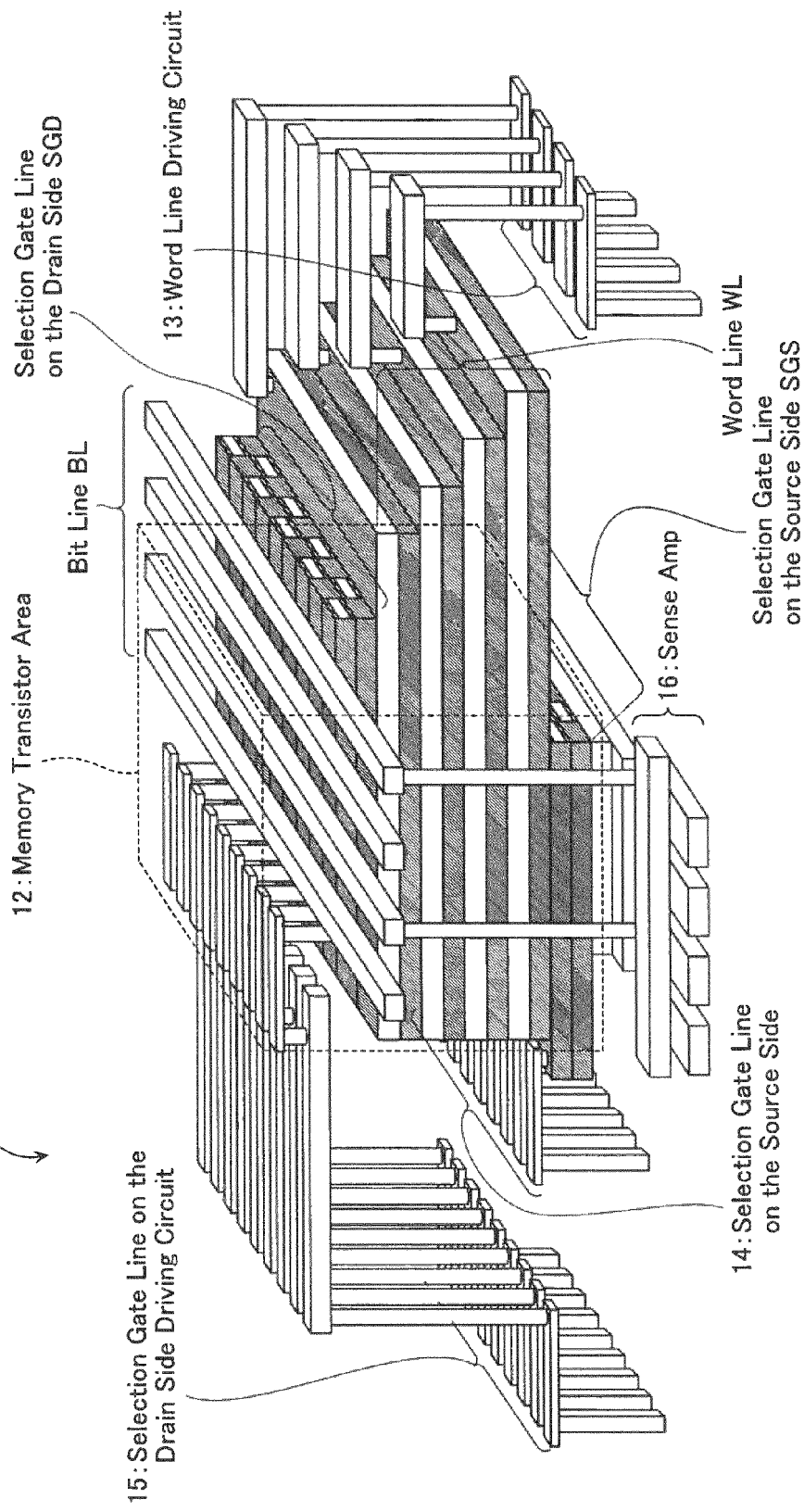
FIG. 1 is a schematic configuration diagram of a non-volatile semiconductor storage device according to a first embodiment of the present invention.

FIG. 1 is a schematic diagram of a non-volatile semiconductor storage device 10 according to a first embodiment of the present invention. As illustrated in FIG. 1, the non-volatile semiconductor storage device 10 according to the first embodiment mainly comprises: a memory transistor area 12; a word line driving circuit 13; a selection gate line on the source side (SGS) driving circuit 14; a selection gate line on the drain side (SGD) driving circuit 15; and a sense amp 16. The memory transistor area 12 has memory transistors for storing data. The word line driving circuit 13 controls voltage applied to word line WL. The selection gate line on the source side (SGS) driving circuit 14 controls voltage applied to selection gate line on the source side SGS. The selection gate line on the drain side (SGD) driving circuit 15 controls voltage applied to selection gate line on the drain side SGD. The sense amp 16 amplifies a potential read from a memory transistor MTrmn. In addition to this, the non-volatile semiconductor storage device 10 according to the first embodiment comprises a bit line driving circuit for controlling voltage applied to bit line BL and a source line driving circuit for controlling voltage applied to source line SL (not illustrated).

In addition, as illustrated in FIG. 1, in the non-volatile semiconductor storage device 10 according to the first embodiment, the memory transistors MTrmn that configure the memory transistor area 12 are formed by lamination of a plurality of semiconductor layers. In addition, as illustrated in FIG. 1, a word line WL of each layer expands in a certain area in a two-dimensional manner. The word line WL of each area has a planar structure of the same layer, respectively.

Figure 2:
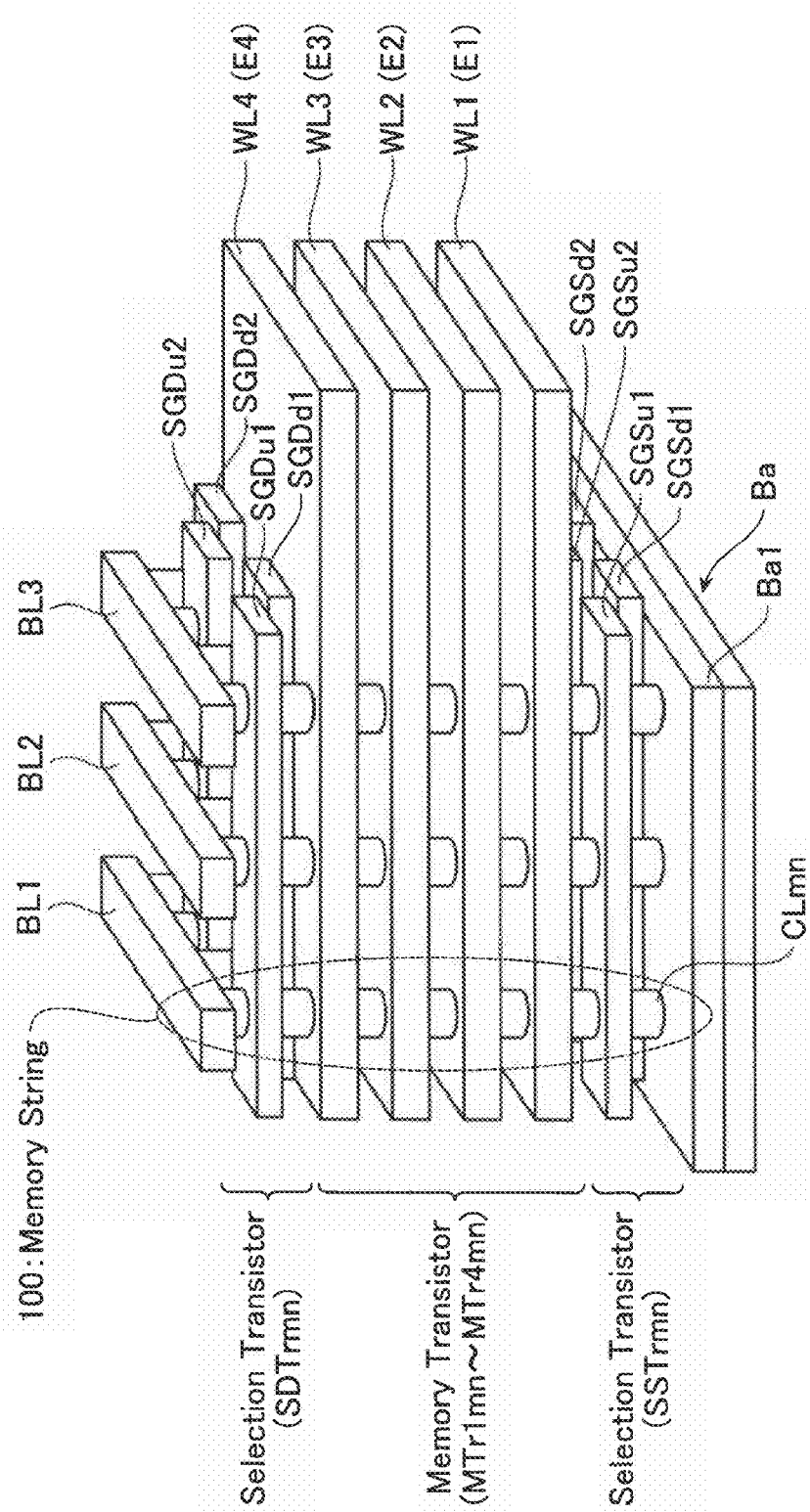
FIG. 2 is a perspective view schematically illustrating a part of the memory transistor area 12 in the non-volatile semiconductor storage device according to the first embodiment of the present invention.

FIG. 2 is a schematic configuration diagram illustrating a part of the memory transistor area 12 in the non-volatile semiconductor storage device 10 according to the first embodiment. According to the first embodiment, the memory transistor area 12 has m×n (m and n denote natural numbers) memory strings 100 including memory transistors MTr1$mn$ to MTr4$mn$ and selection transistors SSTrmn and SDTrmn. FIG. 2 shows an example with m=3, n=4.

In each of the memory strings 100, each of word lines WL1-WL4 connected to the gate of each of the memory transistors MTr1$mn$-MTr4$mn$ is formed by the same conductive layer and used in common therein. That is, in the memory strings 100, all gates of the memory transistor MTr1$mn$ are connected to the word line WL1. In addition, in the memory strings 100, all gates of the memory transistor MTr2 nm are connected to the word line WL2. In addition, in the memory strings 100, all gates of the memory transistor MTr3 nm are connected to the word line WL3. In addition, in the memory strings 100, all gates of the memory transistor MTr4 nm are connected to the word line WL4. As illustrated in FIGS. 1 and 2, in the non-volatile semiconductor storage device 10 according to the first embodiment, each of the word lines (WL1-WL4) expands in a two-dimensional manner and has a plate-like planar structure. In addition, the word lines (WL1-WL4) are arranged substantially perpendicular to the respective memory strings 100. The word lines (WL1 to WL4) may not necessarily be arranged completely perpendicular thereto. That is, it is assumed herein that the term "substantially perpendicular" includes variations such that advantages of the present invention may be obtained.

Each of the memory strings 100 has columnar semiconductor CLmn (in the case of FIG. 2, m=1-3, n=1-4) provided on an N+ area formed on a P-well area Ba1 of a semiconductor substrate Ba. The columnar semiconductors CLmn are formed in a direction perpendicular to the semiconductor substrate Ba and arranged in a matrix form on the surfaces of the semiconductor substrate Ba and the word lines (WL1-WL4). That is, the memory strings 100 are positioned in a matrix form within a plane perpendicular to the corresponding columnar semiconductor CLmn. Besides, the columnar semiconductors CLmn may be columnar or prismatic in shape. In addition, the columnar semiconductors CLmn include terraced columnar semiconductors. Besides, the columnar semiconductor CLmn has a diameter (width) of, e.g., "F", which is the length of the resolution limit of lithography.

Figure 3:
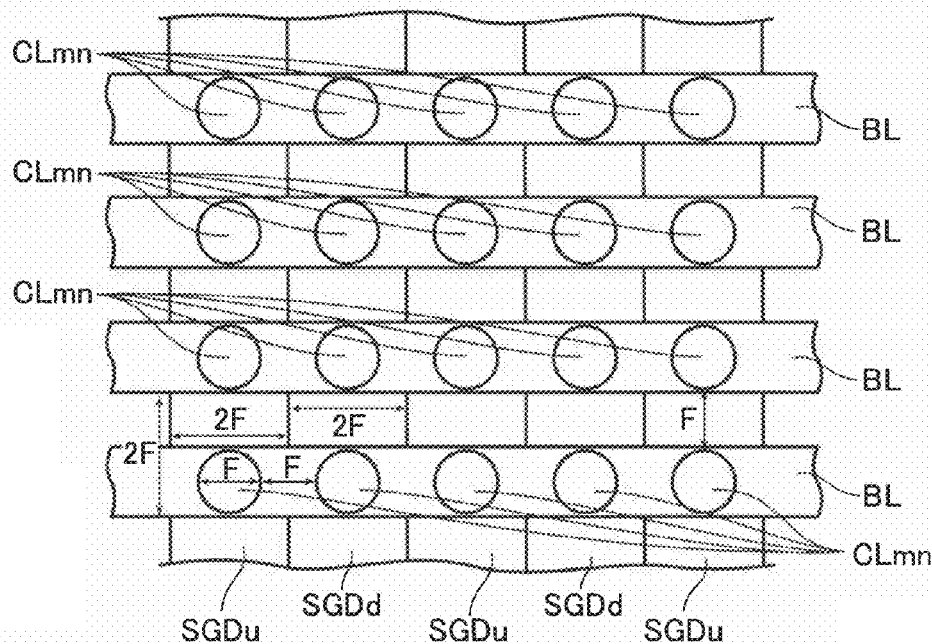
FIG. 3 is a top plan view schematically illustrating a part of the memory transistor area 12 in the non-volatile semiconductor storage device according to the first embodiment of the present invention.
Figure 4:
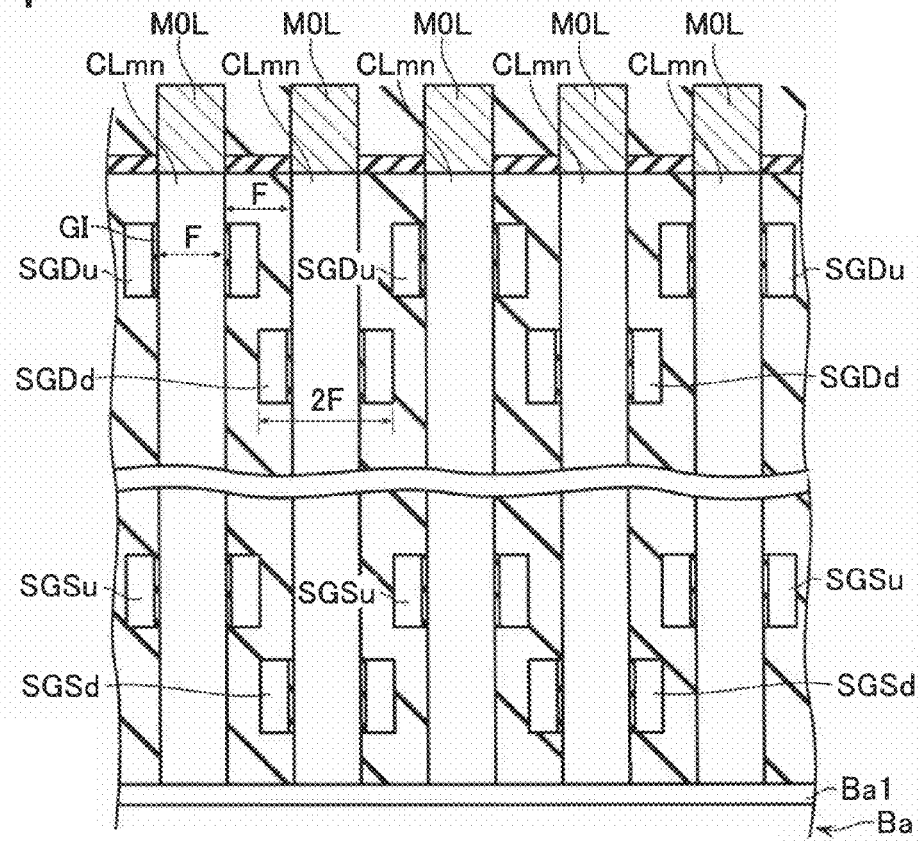
FIG. 4 is a cross-sectional view schematically illustrating a part of the memory transistor area 12 in the non-volatile semiconductor storage device according to the first embodiment of the present invention.

Referring now to FIGS. 2-4, the configuration of the selection gate line on the drain side SGD and the selection gate line on the source side SGS is described. FIG. 3 is a top plan view of the memory transistor area 12, and FIG. 4 is a cross-sectional view of the memory transistor area 12.

As illustrated in FIGS. 2-4, there are provided selection gate lines on the drain side SGD (conductive layers) on the upper portions of the memory string 100. They contact columnar semiconductors CLmn via insulating films GI to configure respective selection transistors SDTrmn. The selection gate lines on the drain side SGD correspond to the gate electrodes of the selection transistors SDTrmn. Each of the selection gate lines on the drain side SGD, which has a rectangular plate shape and a width of "2 F", is arranged in a stripe form, insulated and isolated from each other at intervals with a certain pitch. In addition, at the center in the width direction of the selection gate line on the drain side SGD, there is provided a columnar semiconductor CLmn that has a diameter (width) of "F" and is formed to penetrate that center.

The selection gate lines on the drain side SGD include lower selection gate lines on the drain side SGDd (in the case of FIG. 2, SGDd1 and SGDd2) (first conductive layers) that are located adjacent the upper surface of the word line WL4, and upper selection gate lines on the drain side SGDu (in the case of FIG. 2, SGDu1 and SGDu2) (second conductive layers) that are located above the lower selection gate lines on the drain side SGDd.

The lower selection gate lines on the drain side SGDd, each of which has a width of "2 F" in the width direction, are arranged at certain intervals of "2 F" in between. On the other hand, the upper selection gate lines on the drain side SGDu, each of which has a width of "2 F" in the width direction, are arranged at certain intervals of "2 F" in between and above the lower selection gate lines on the drain side SGDd by certain intervals of "2 F", respectively. That is, in other words, each of the upper selection gate lines on the drain side SGDu and each of the lower selection gate lines on the drain side SGDd are arranged with a deviation of "2 F" from each other in the width direction.

In addition, as illustrated in FIGS. 2-4, there are provided selection gate lines on the source side SGS (conductive layers) on the lower portions of the memory string 100. They contact columnar semiconductors CLmn via insulating film GI to configure respective selection transistors SSTrmn. The selection gate lines on the source side SGS correspond to the gate electrodes of the selection transistors SSTrmn. Each of the selection gate lines on the source side SGS, which has a rectangular plate shape and a width of "2 F", is arranged in a stripe form, insulated and isolated from each other at intervals with a certain pitch. In addition, at the center in the width direction of the selection gate lines on the source side SGS, there is provided a columnar semiconductor CLmn that has a diameter (width) of "F" and is formed to penetrate that center.

The selection gate lines on the source side SGS include upper selection gate lines on the source side SGSu (in the case of FIG. 2, SGSu1 and SGSu2) (second conductive layers) that are located adjacent the lower surface of the word line WL1, and lower selection gate lines on the source side SGSd (in the case of FIG. 2, SGSd1 and SGSd2) (first conductive layers) that are located below the upper selection gate lines on the source side SGSu.

The upper selection gate lines on the source side SGSu, each of which has a width of "2 F" in the width direction, are arranged at certain intervals of "2 F" in between. On the other hand, the lower selection gate lines on the source side SGSu, each of which has a width of "2 F" in the width direction, are arranged at certain intervals of "2 F" in between. In addition, the upper selection gate lines on the source side SGSu are arranged above the lower selection gate lines on the source side SGSd by certain intervals of "2 F", respectively. That is, in other words, each of the upper selection gate lines on the source side SGSu and each of the lower selection gate lines on the source side SGSd are arranged with a deviation of "2 F" from each other in the width direction.

Besides, any one of the selection gate lines on the source side SGSu/SGSd and the selection gate lines on the drain side SGDu/SGDd may have a plate-like planar structure as described above similar to the word line WL.

Figure 5:
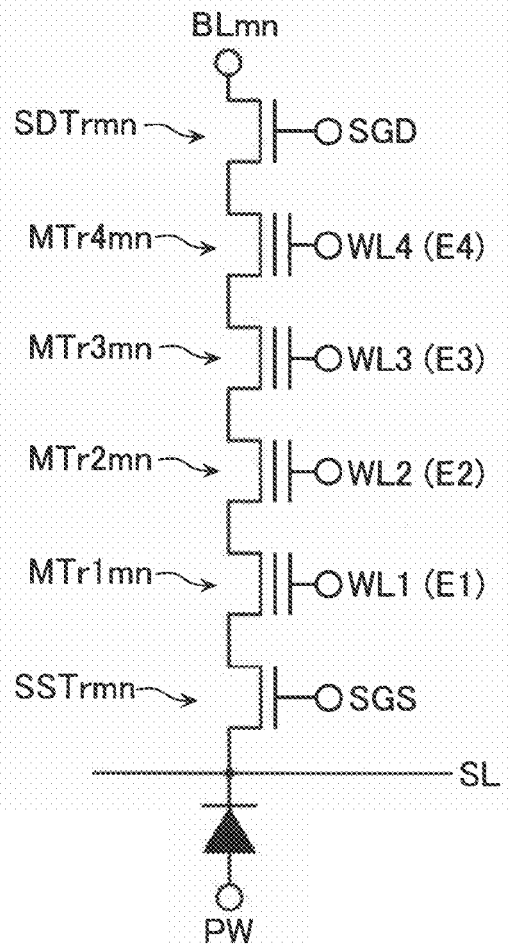
FIG. 5 is a circuit diagram illustrating one of the memory string 100 in the non-volatile semiconductor storage device according to the first embodiment of the present invention.
Figure 6:
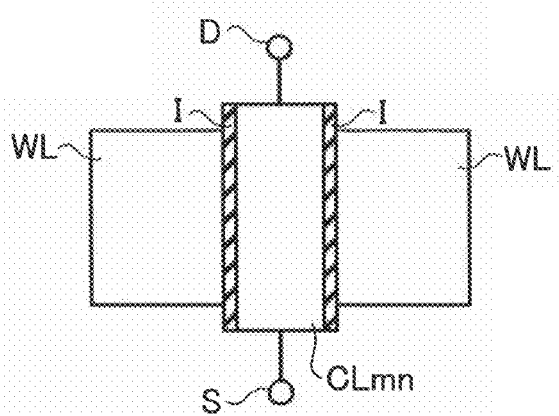
FIG. 6 is a diagram illustrating a cross-sectional structure of one memory transistor MTr in the non-volatile semiconductor storage device according to the first embodiment of the present invention.

Referring now to FIGS. 4-6, the operations and circuit configuration of the memory string 100 in the first embodiment will be described. FIG. 5 is a circuit diagram of one memory string 100 in the first embodiment, and FIG. 6 is a cross-sectional diagram of one memory transistor MTr in the first embodiment.

As illustrated in FIG. 5, in the first embodiment, the memory string 100 has four memory transistors MTr1*mn*-MTr4*mn* and two selection transistors SSTrm and SDTrmn. These four memory transistors MTr1*mn*-MTr4*mn* and two selection transistors SSTrmn and SDTrmn are connected in series, respectively (see FIG. 5). According to the first embodiment, in the memory string 100, a columnar semiconductor CLmn is formed on an N+ area that is formed in a P-type area (P-well area) Ba1 on the semiconductor substrate Ba. Further, a plurality of plate-like electrodes E1-E4 are formed by the word lines WL1 to WL4, each of which is formed around the columnar semiconductors CLmn via corresponding insulating films I. The memory transistors MTr1*mn*-MTr4*mn* are formed by these electrodes E1-E4, insulating films I and columnar semiconductors CLmn. Besides, the insulating film I serves as a charge accumulation layer (e.g., a laminated film of silicon oxide/silicon nitride/silicon oxide). For example, if the insulating film I is a silicon oxide/silicon nitride/silicon oxide film, which is so-called an ONO film, then charges are retained in SiN traps that are discretely distributed in the silicon nitride film. In addition, a source line SL (in the first embodiment, an N+ area in the P-well area Ba1) is connected to the source of each selection transistor SSTrmn. In addition, M0 wirings M0L for connection to the bit lines BL are formed in the drains of the selection transistors SDTrmn.

As illustrated in FIG. 6, in one memory transistor MTrmn, a word line WL (conductive layers), which surrounds a columnar semiconductor CLmn via an insulating film I, serves as a control gate electrode. The source S and drain D of the memory transistors MTr are formed in a corresponding columnar semiconductor CLmn.

In the non-volatile semiconductor storage device 10 with the above-mentioned configuration, the voltages of the bit line BL, selection gate line on the drain side SGD, word line WL, selection gate line on the source side SGS, and source line SL are controlled by a bit line driving circuit (not illustrated), selection gate line on the drain side driving circuit 15, word line driving circuit 13, selection gate line on the source side driving circuit 14, and source line driving circuit (not illustrated), respectively. That is, data read/write/erase operations are performed by controlling charges to be retained (trapped) in a charge accumulation layer (insulating film I) of a certain memory transistor MTr.

As can be seen from the above, the non-volatile semiconductor storage device according to the first embodiment has a structure where the memory transistors MTr1-MTr4 (memory cells) are laminated in a three-dimensional manner. Further, as the selection gate lines on the drain side SGD (conductive layers), two layers are provided in the first embodiment: the upper selection gate lines on the drain side SGDu and the lower selection gate lines on the drain side SGDd. In this case, the upper selection gate lines on the drain side SGDu and the lower selection gate lines on the drain side SGDd are arranged in gaps in between. In addition, the selection gate lines on the source side SGS (conductive layers) have a configuration similar to that of the selection gate lines on the drain side SGD (conductive layers). Accordingly, in the first embodiment, if the columnar semiconductor CLmn has a diameter of "F" (which is the length of the resolution limit of lithography), then the minimum occupation area of the memory string 100 may be "4 $F^2$", allowing a significant reduction in the minimum occupation area, which would otherwise be "6 $F^2$", conventionally.

Second Embodiment

Configuration of Second Embodiment

Figure 7:
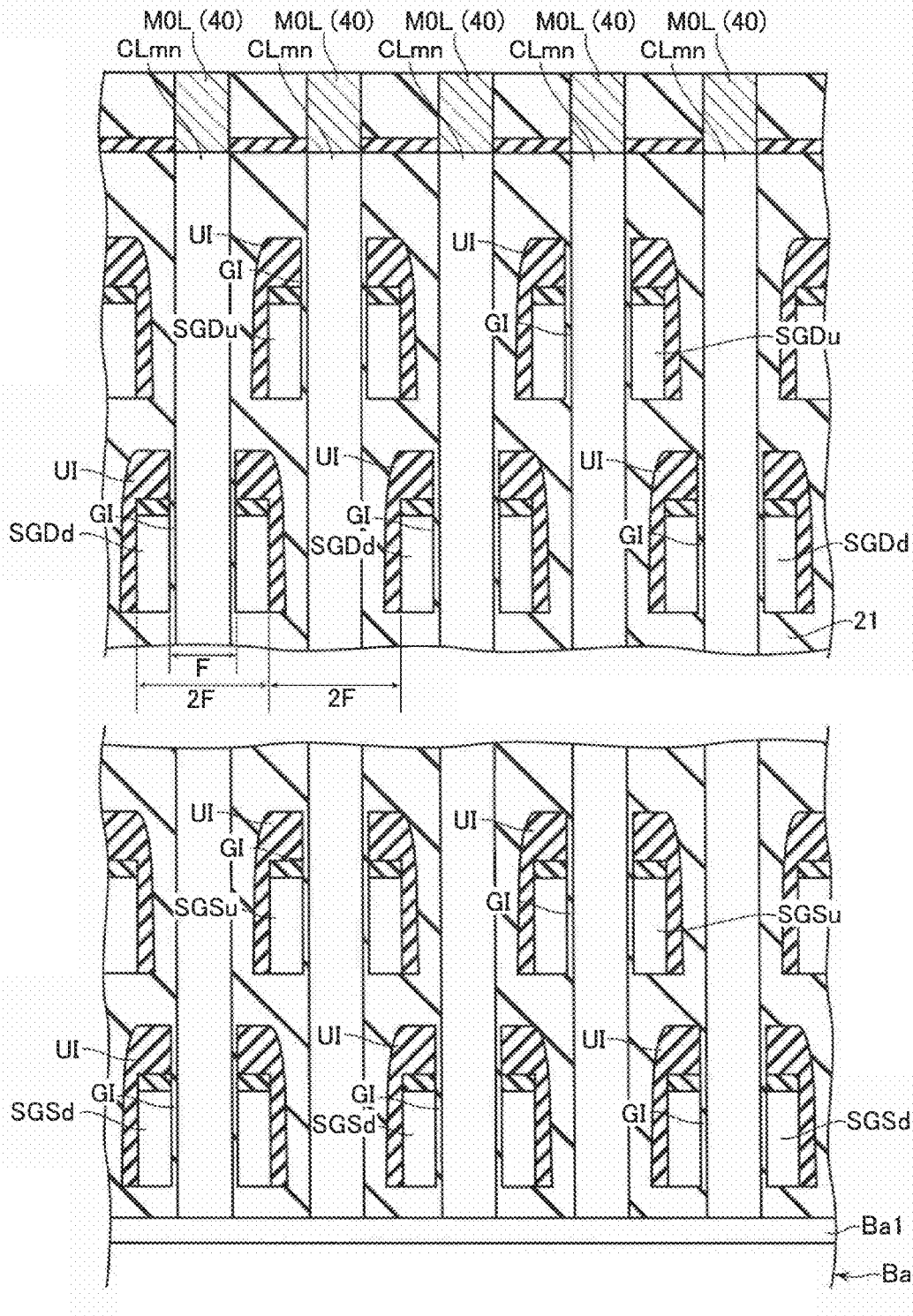
FIG. 7 is a cross-sectional view schematically illustrating a part of the memory transistor area 12 in a non-volatile semiconductor storage device according to a second embodiment of the present invention.

Referring now to FIG. 7, a non-volatile semiconductor storage device according to a second embodiment of the present invention is described. FIG. 7 is a cross-sectional view of a memory transistor area 12 of the second embodiment. As illustrated in FIG. 7, a configuration of the non-volatile semiconductor storage device according to the second embodiment differs from that of the first embodiment, mainly in that insulating films UI are provided therein to cover the gate selection lines SGD and SGS at their upper and side portions. The insulating films UI include, for example, silicon nitride (SiN) films. Such silicon nitride films have a selection ratio for wet etching, higher than that of an amorphous silicon layer that configures selection gate lines SGD and SGS and an insulating layer 21. Besides, in the second embodiment, insulating films UI similar to the selection gate lines on the drain side SGD are also provided in the area of selection gate lines on the source side SGS. The other components of the second embodiment are the same as those described in the first embodiment. Accordingly, the same reference numerals represent the same components and description thereof will be omitted.

(Manufacturing Method of Second Embodiment)

Referring now to FIGS. 8-24, a method of manufacturing the above-mentioned non-volatile semiconductor storage device according to the second embodiment is described. Here, only a method of manufacturing the selection gate lines on the drain side SGD is described. In addition, since the method of manufacturing the selection gate line on the source side SGS is similar to that of the selection gate line on the drain side SGD, and the methods of manufacturing the word line WL and memory transistor MTrmn are similar to those conventionally employed, description thereof will be omitted.

Figure 8:
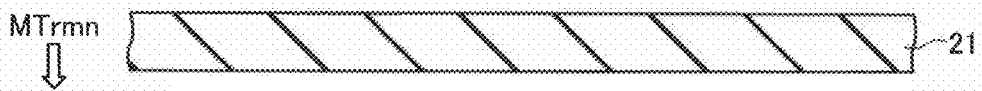
FIG. 8 is a cross-sectional view illustrating a manufacturing process of the non-volatile semiconductor storage device according to the second embodiment of the present invention.

Firstly, as illustrated in FIG. 8, the manufacturing process is advanced to a state where the insulating layer 21 is formed on the word line WL4 at the top layer. That is, in FIG. 8, the process is advanced to a state where a layer corresponding to the memory transistor MTrmn area is formed below the insulating layer 21 (MTrmn indicated by the down-arrow in FIG. 8).

Figure 9:
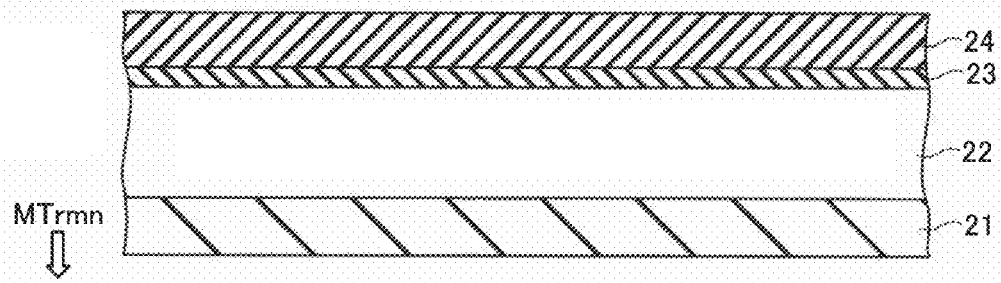
FIG. 9 is a cross-sectional view illustrating a manufacturing process of the non-volatile semiconductor storage device according to the second embodiment of the present invention.

Then, an amorphous silicon layer 22 is deposited on the insulating layer 21 and boron (B) is injected thereto. An oxide film 23 and a silicon nitride (SiN) film 24 are further deposited thereon, which results in the state as illustrated in FIG. 9. The amorphous silicon layer 22 provides the lower selection gate line on the drain side SGDd mentioned above. For example, the amorphous silicon layer 22 has a thickness of 200 nm, the oxide film 23 has a thickness of 15 nm, and the silicon nitride film 24 has a thickness of 50 nm, respectively.

Figure 10:
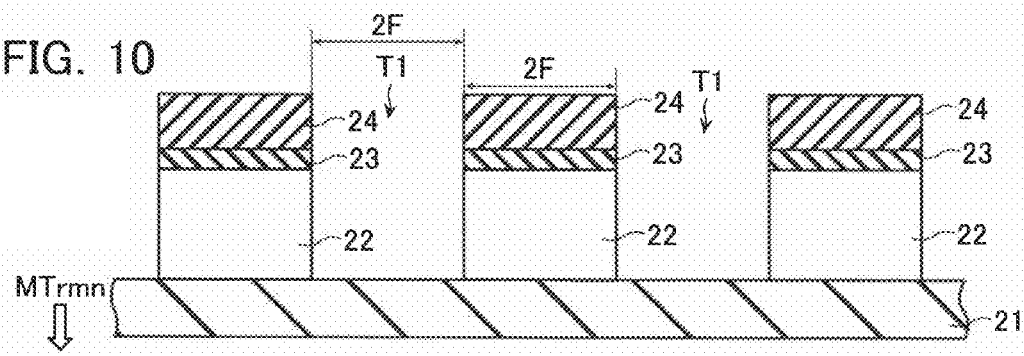
FIG. 10 is a cross-sectional view illustrating a manufacturing process of the non-volatile semiconductor storage device according to the second embodiment of the present invention.

Then, as illustrated in FIG. 10, a lithography process is performed. Resists of mask material are patterned in a stripe form on the silicon nitride film 24, with a width of, and spaced apart by "2 F" (i.e., line and space of "4 F" pitch). Then, Reactive Ion Etching (RIE) is performed to remove parts of the silicon nitride film 24, the oxide film 23, and the amorphous silicon layer 22. Through this process, such trenches T1 are formed that extend from the surfaces of the silicon nitride films 24 to the upper surfaces of the insulating layer 21. At this moment, amorphous silicon layers 22 have the shape of the lower selection gate line on the drain side SGDd. In this case, for example, "2 F" is 180 nm.

Figure 11:
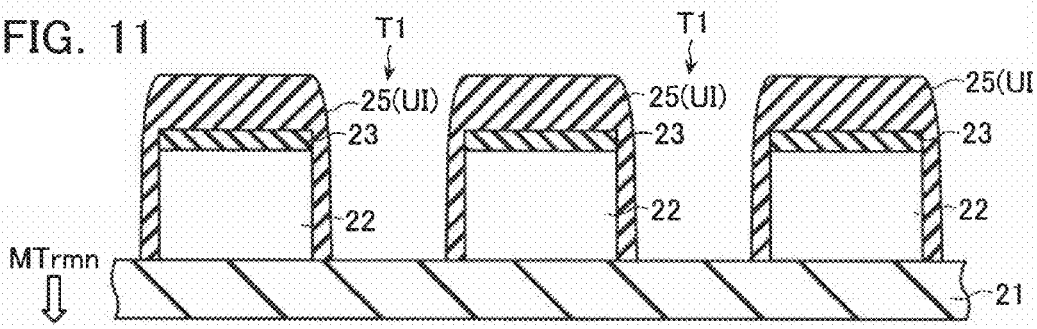
FIG. 11 is a cross-sectional view illustrating a manufacturing process of the non-volatile semiconductor storage device according to the second embodiment of the present invention.

Then, as illustrated in FIG. 11, Chemical Vapor Deposition (CVD) process is performed to deposit a silicon nitride film 25 on the sidewall of the trench T1 and the surface of the silicon nitride film 24, respectively. The silicon nitride film 24 and the silicon nitride film 25 together form one insulating film UI as mentioned above. Besides, silicon nitride film deposited on the bottom surface of the trench T1 is removed by etching or the like.

Figure 12:
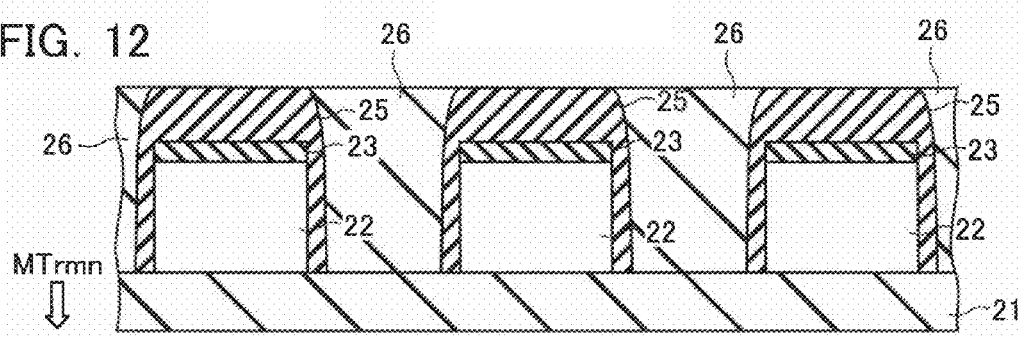
FIG. 12 is a cross-sectional view illustrating a manufacturing process of the non-volatile semiconductor storage device according to the second embodiment of the present invention.

Then, as illustrated in FIG. 12, an oxide film 26 is deposited within the trenches T1, which is later flattened by CMP (Chemical Mechanical Polishing) process until a surface is provided at the level of the upper surfaces of the silicon nitride films 25. Through the process illustrated in FIG. 12, the trenches T1 are filled with the oxide film 26.

Figure 13:
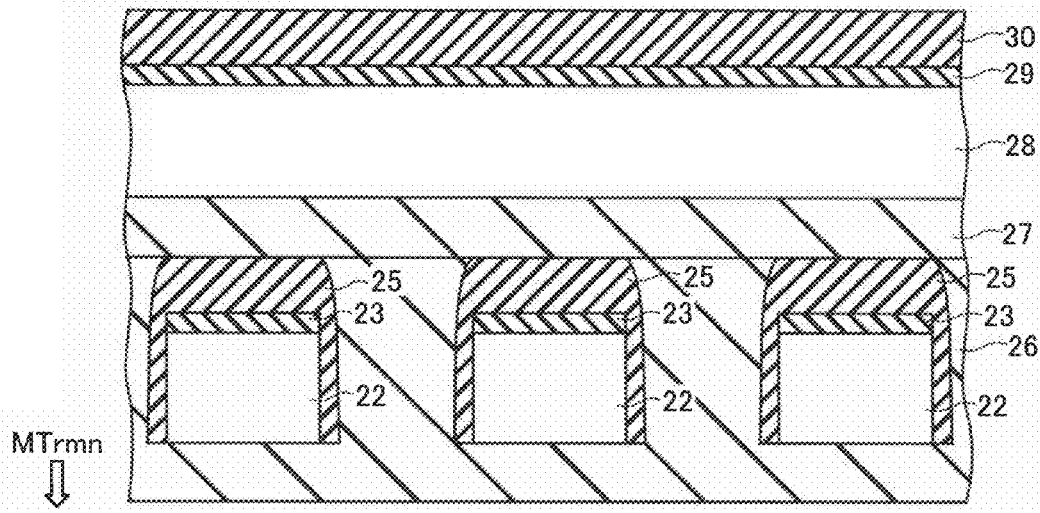
FIG. 13 is a cross-sectional view illustrating a manufacturing process of the non-volatile semiconductor storage device according to the second embodiment of the present invention.

Then, an oxide film (TEOS film) 27 and an amorphous silicon layer 28 are deposited on the oxide film 26 and the silicon nitride film 25, and boron (B) is injected to the amorphous silicon layer 28. Then, an oxide film (TEOS film) 29 and a silicon nitride film 30 are deposited on the amorphous silicon layer 28, which results in the state as illustrated in FIG. 13. For example, the oxide film (TEOS film) 27 has a thickness of 50 nm, the amorphous silicon layer 28 has a thickness of 200 nm, the oxide film (TEOS film) 29 has a thickness of 15 nm, and the silicon nitride film 30 has a thickness of 50 nm, respectively.

Figure 14:
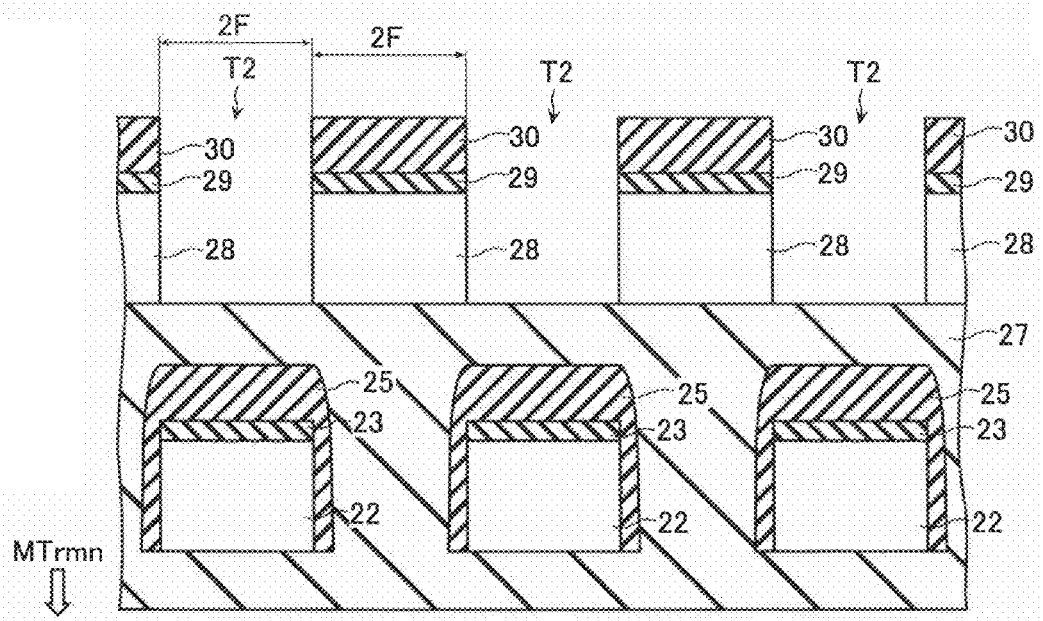
FIG. 14 is a cross-sectional view illustrating a manufacturing process of the non-volatile semiconductor storage device according to the second embodiment of the present invention.

Then, as illustrated in FIG. 14, a lithography process is performed. Resists of mask material are patterned in a stripe form on those regions of the silicon nitride film 30 that correspond to the gaps between the amorphous silicon layers 22 (lower selection gate lines on the drain side SGDd), with a width of, and spaced apart by "2 F" (i.e., line and space of "4 F" pitch). Then, Reactive Ion Etching (RIE) is performed to remove parts of the silicon nitride film 30, the oxide film (TEOS film) 29, and the amorphous silicon layer 28. Through this process, such trenches T2 are formed that extend from the surfaces of the silicon nitride films 30 to the upper surface of the oxide film (TEOS) 27. At this moment, amorphous silicon layers 28 have the shape of the upper selection gate line on the drain side SGDu. In this case, for example, "2 F" is 180 nm.

Figure 15:
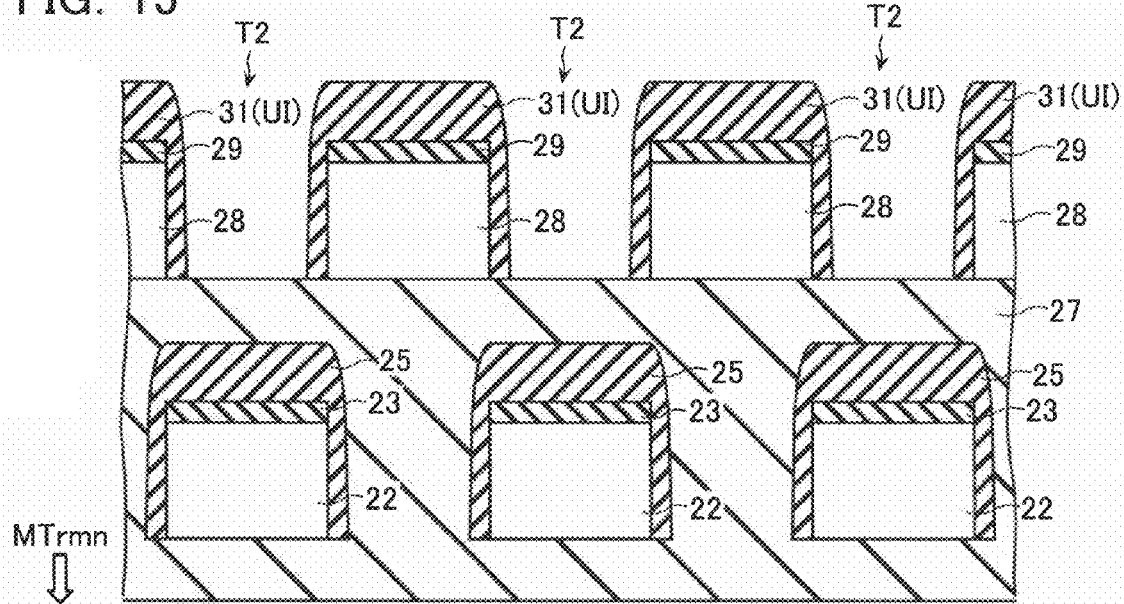
FIG. 15 is a cross-sectional view illustrating a manufacturing process of the non-volatile semiconductor storage device according to the second embodiment of the present invention.

Then, as illustrated in FIG. 15, CVD process is performed to deposit a silicon nitride film 31 on the sidewall of the trench T2 and the surface of the silicon nitride film 30, respectively. The silicon nitride film 30 and the silicon nitride film 31 together form one insulating film UI as mentioned above. Besides, silicon nitride film 31 deposited on the bottom surface of the trench T2 is removed by etching or the like.

Figure 16:
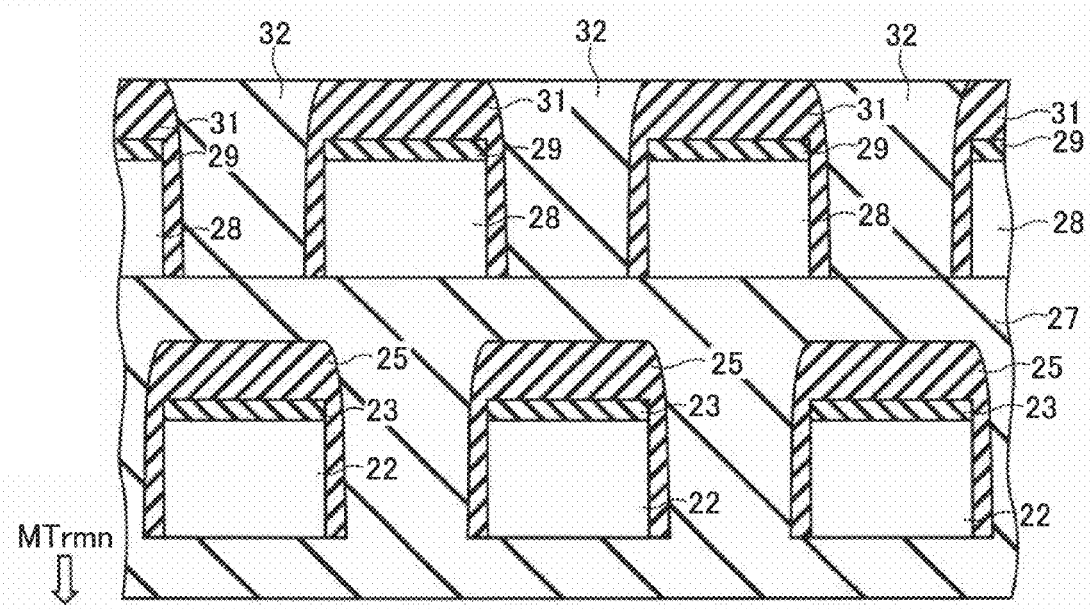
FIG. 16 is a cross-sectional view illustrating a manufacturing process of the non-volatile semiconductor storage device according to the second embodiment of the present invention.
Figure 17:
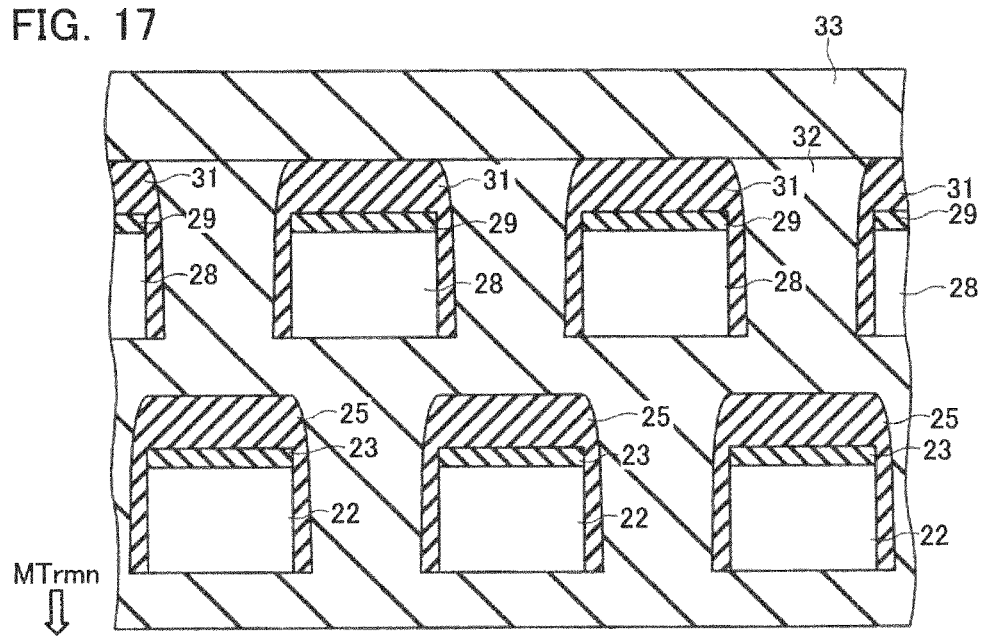
FIG. 17 is a cross-sectional view illustrating a manufacturing process of the non-volatile semiconductor storage device according to the second embodiment of the present invention.

Then, as illustrated in FIG. 16, an oxide film 32 is deposited within the trenches T2, which is later flattened by CMP process until a surface is provided at the level of the upper surfaces of the silicon nitride films 31. Through the process illustrated in FIG. 16, the trenches T2 are filled with the oxide film 32. Then, as illustrated in FIG. 17, an oxide film 33 is further deposited on the oxide film 32 and the silicon nitride film 31. For example, the oxide film 33 is deposited to a thickness of 200 nm.

Figure 18:
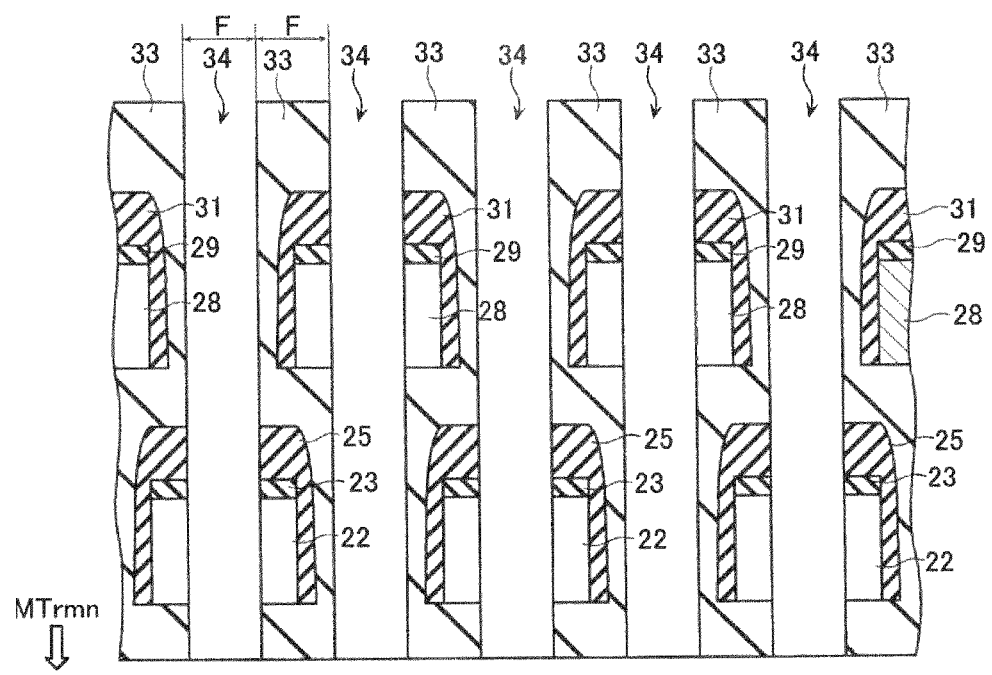
FIG. 18 is a cross-sectional view illustrating a manufacturing process of the non-volatile semiconductor storage device according to the second embodiment of the present invention.

Then, as illustrated in FIG. 18, lithography and RIE processes are performed. Through the lithography and RIE processes, through-holes 34 are formed in a grid form on the oxide film 33, with a diameter of, and spaced apart by "F". Each of the through-holes 34 is formed so as to pass through the center in the width direction of each of the amorphous silicon layers (lower selection gate lines on the drain side SGDd) 22 as well as the center in the width direction of each of the amorphous silicon layers (upper selection gate lines on the drain side SGDu) 28. Besides, the through-hole 34 is formed to a depth sufficient to reach the corresponding memory transistor MTrmn area. For example, the through-hole 34 has a diameter of 90 nm.

Figure 19:
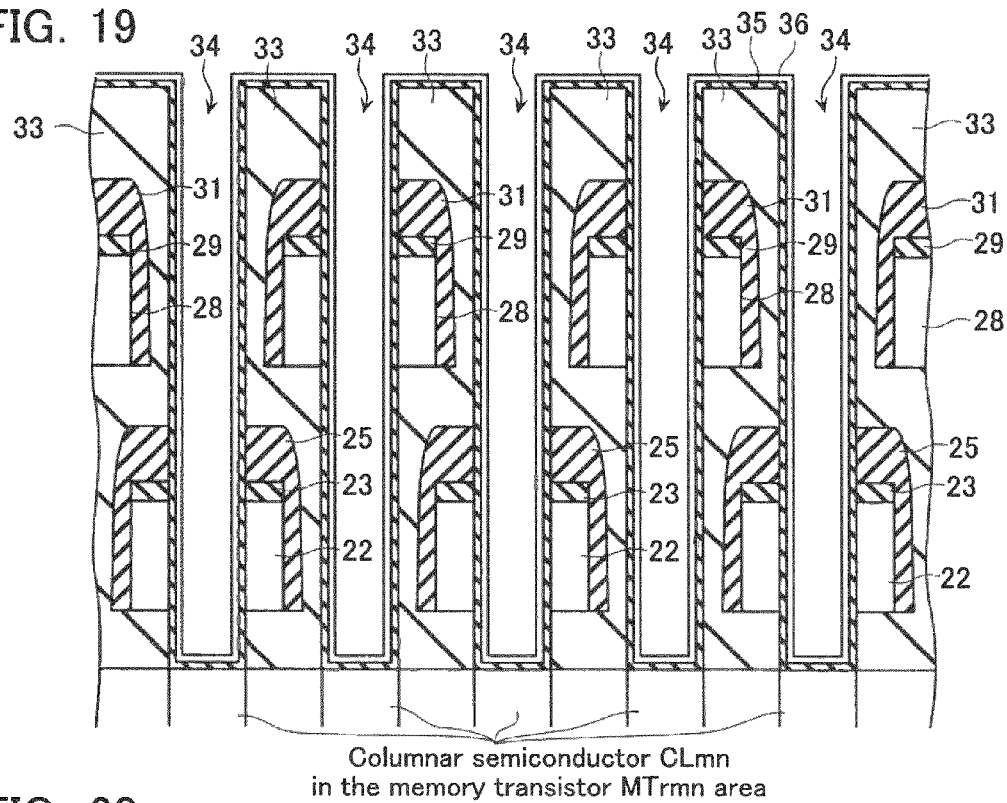
FIG. 19 is a cross-sectional view illustrating a manufacturing process of the non-volatile semiconductor storage device according to the second embodiment of the present invention.

Then, as illustrated in FIG. 19, a gate oxide film 35 and an amorphous silicon layer 36 are formed on the surface of the through-hole 34.

Figure 20:
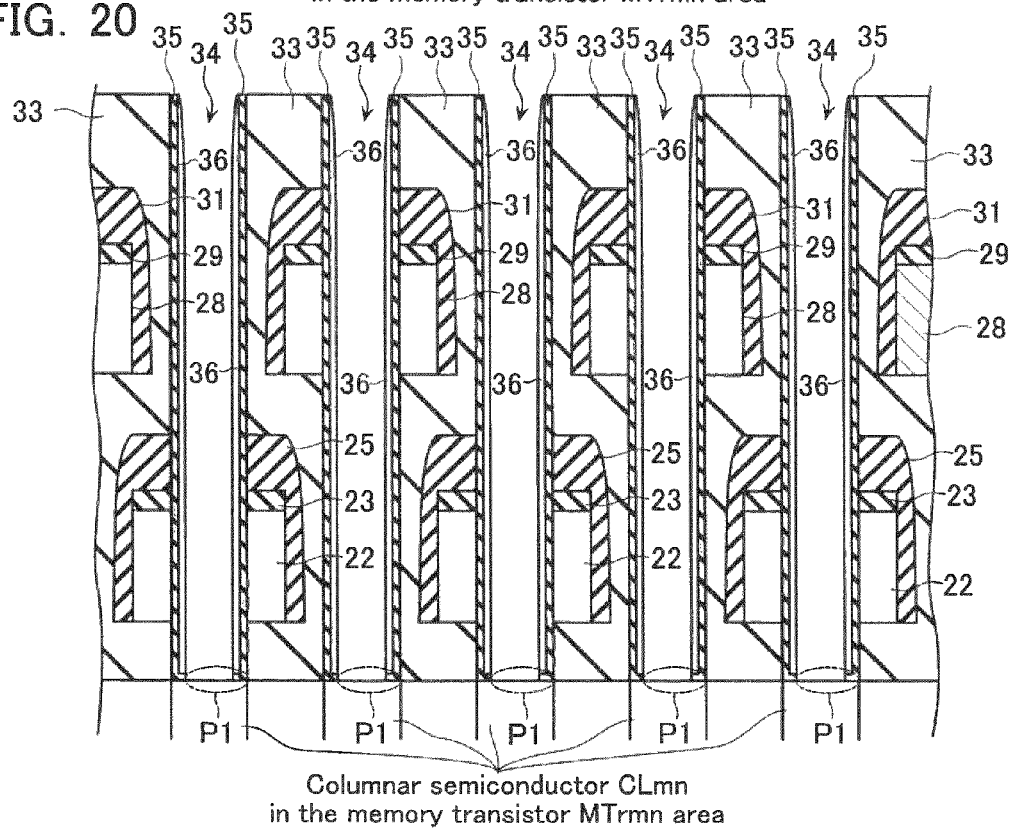
FIG. 20 is a cross-sectional view illustrating a manufacturing process of the non-volatile semiconductor storage device according to the second embodiment of the present invention.

Then, as illustrated in FIG. 20, RIE is performed to remove by etching those portions of the gate oxide films 35 (areas P1 illustrated in FIG. 20) that are formed on the bottom surfaces of the through-holes 34. On the other hand, since those portions of the gate oxide films 35 that are formed on the sidewalls of the through-holes 34 are preserved by corresponding amorphous silicon layers 36 formed thereon, those portions still remains without being removed by etching.

Figure 21:
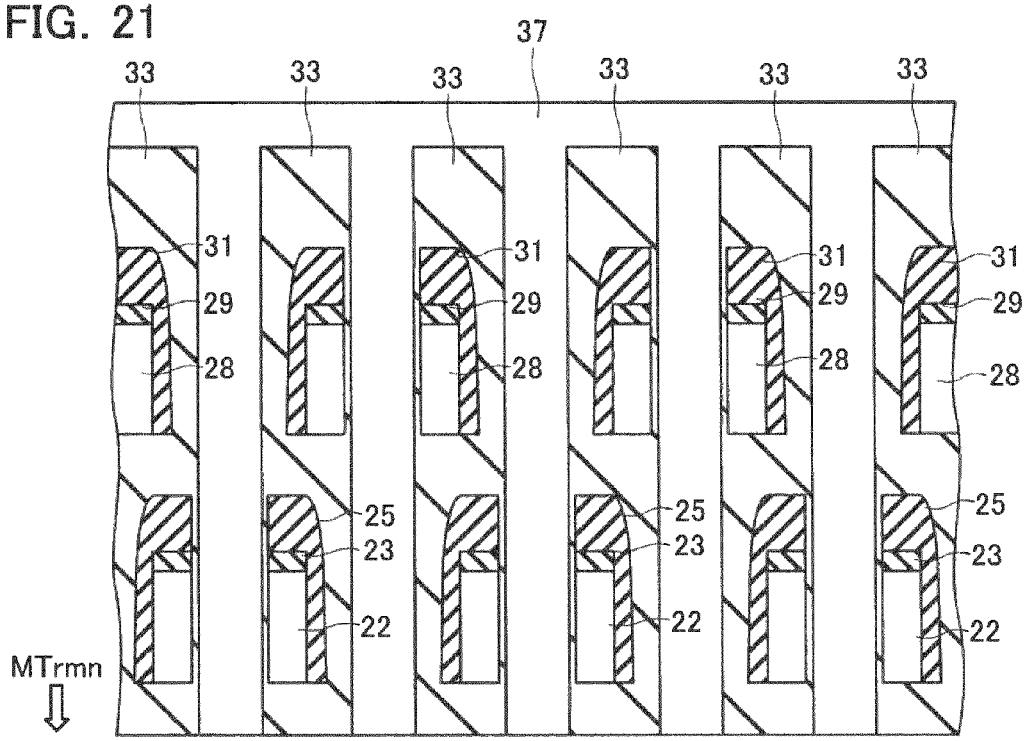
FIG. 21 is a cross-sectional view illustrating a manufacturing process of the non-volatile semiconductor storage device according to the second embodiment of the present invention.

Then, as illustrated in FIG. 21, an amorphous silicon layer 37 is deposited within the through-holes 34. The amorphous silicon layer 37 deposited in this process provides columnar semiconductors CLmn.

Figure 22:
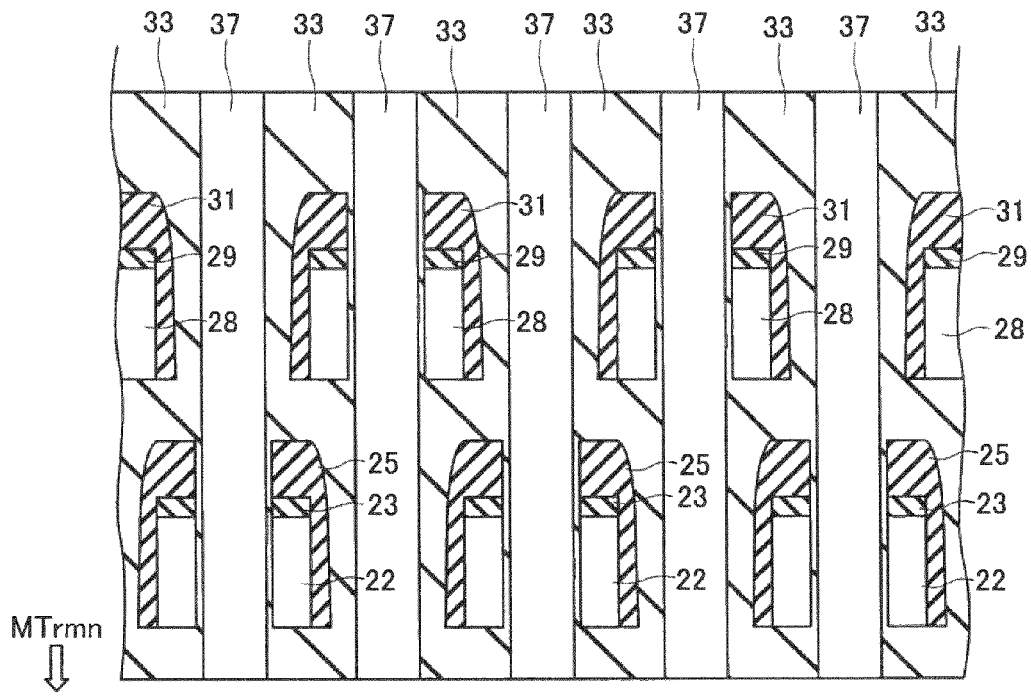
FIG. 22 is a cross-sectional view illustrating a manufacturing process of the non-volatile semiconductor storage device according to the second embodiment of the present invention.

Then, as illustrated in FIG. 22, the amorphous silicon layer 37 is etch-backed so that a surface is provided at the level of the upper surfaces of the oxide films 33.

Figure 23:
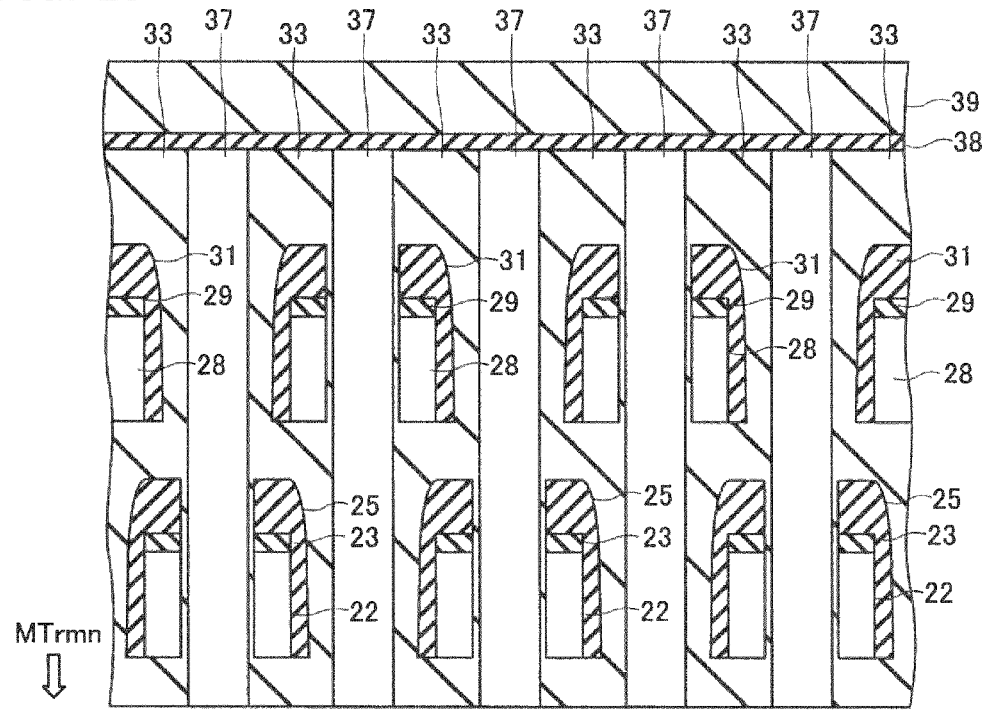
FIG. 23 is a cross-sectional view illustrating a manufacturing process of the non-volatile semiconductor storage device according to the second embodiment of the present invention.

Then, as illustrated in FIG. 23, a silicon nitride film 38 and an oxide film 39 are deposited on the surface of the amorphous silicon layer (columnar semiconductor) 37 and the oxide film 33. For example, the silicon nitride film 38 has a thickness of 50 nm and the oxide film 39 has a thickness of 200 nm.

Figure 24:
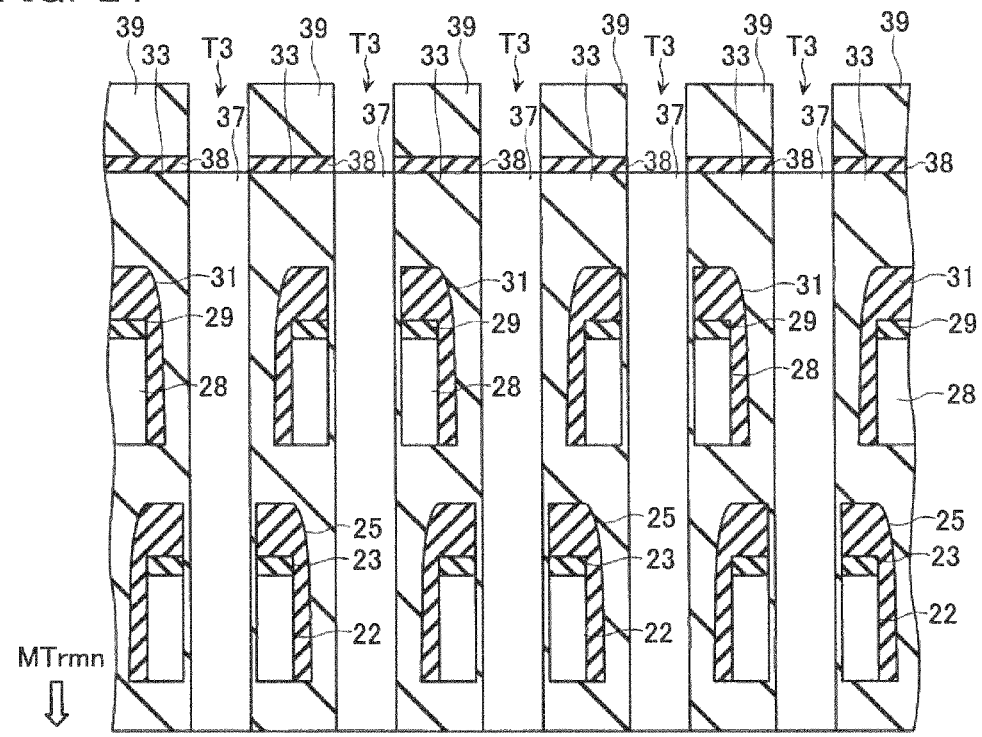
FIG. 24 is a cross-sectional view illustrating a manufacturing process of the non-volatile semiconductor storage device according to the second embodiment of the present invention.

Then, as illustrated in FIG. 24, lithography and RIE processes are performed to remove those portions of the silicon nitride film 38 and the oxide film 39 that are located in correspondence with the amorphous silicon layer (columnar semiconductor) 37, thereby forming trench T3.

Then, titanium (Ti)/titanium nitride (TiN) 40 is deposited within the trench T3, which is later flattened by CMP process. In this way, the non-volatile semiconductor storage device according to the second embodiment is formed as illustrated in FIG. 7. Besides, the deposited titanium (Ti)/titanium nitride (TiN) 40 provides M0 wirings M0L for connection to the bit line BL.

Since the second embodiment manufactured through the above-mentioned process has, as in the first embodiment, upper selection gate line on the drain (source) side SGDu (SGSu) and lower selection gate line on the drain (source) side SGDd (SGSd), it may provide similar advantages to the first embodiment.

Third Embodiment

Configuration of Third Embodiment

Figure 25:
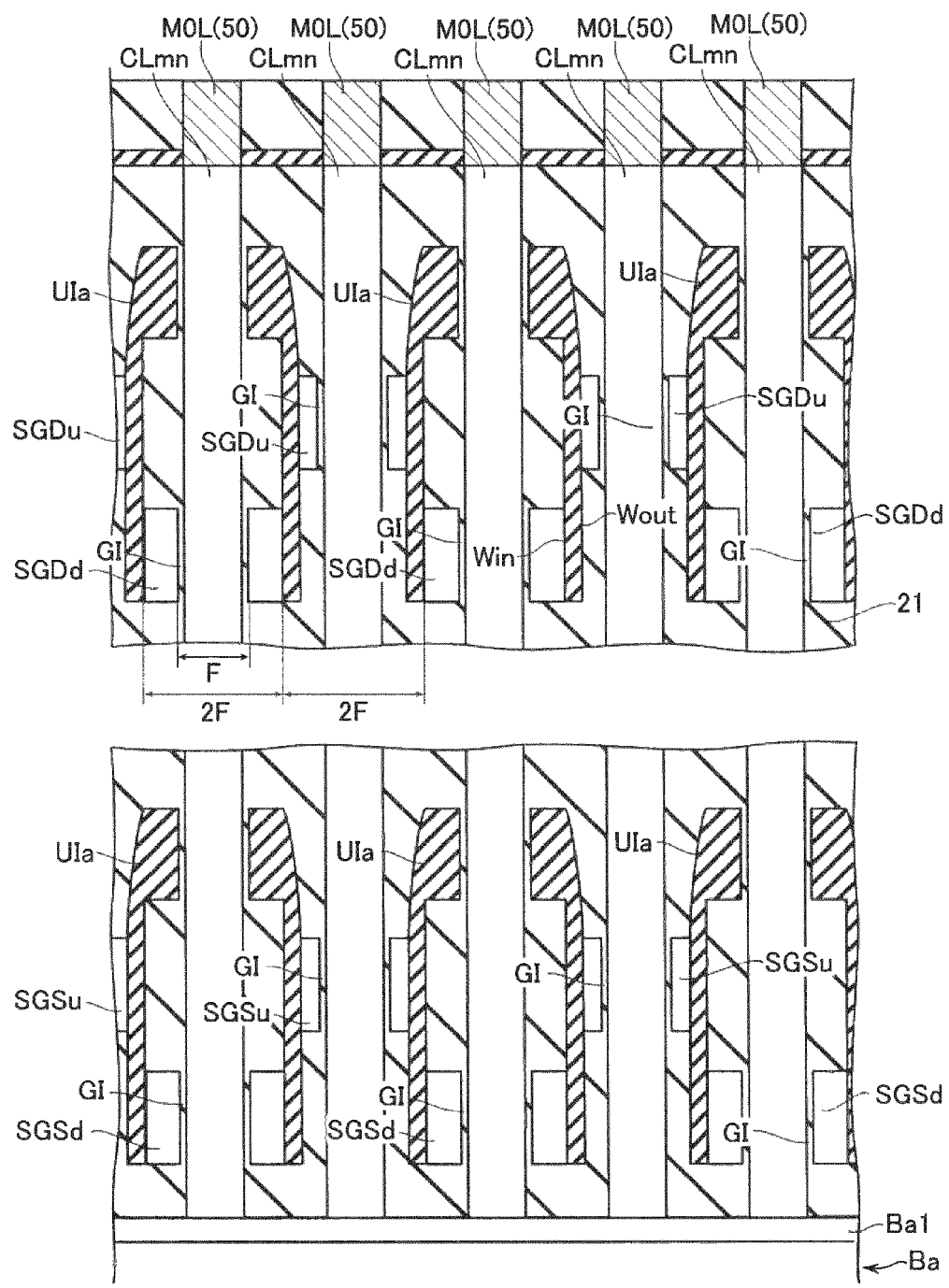
FIG. 25 is a cross-sectional view schematically illustrating a part of the memory transistor area 12 in a non-volatile semiconductor storage device according to a third embodiment of the present invention.

Referring now to FIG. 25, a non-volatile semiconductor storage device according to a third embodiment of the present invention is described. As illustrated in FIG. 25, the non-volatile semiconductor storage device according to the third embodiment has insulating film UIa provided therein to cover the lower selection gate line on the drain side SGDd at their upper and side portions. The insulating film UIa is not formed to cover the upper selection gate line on the drain side SGDu. Rather, the inner sidewall Win and the outer sidewall Wout of the insulating film UIa are adjacent to the upper selection gate line on the drain side SGDu and the lower selection gate line on the drain side SGDd. The inner sidewall Win contacts the lower selection gate lines on the drain side SGDd, while the outer sidewall Wout contacts the upper selection gate lines on the drain side SGDu. To this extent, the insulating film UIa in the third embodiment is different from the insulating film UI in the second embodiment. Besides, in the third embodiment, insulating films UIa similar to those of the lower selection gate lines on the drain side SGDd are also provided in the area of the lower selection gate lines on the source side SGSd. The other components of the third embodiment are the same as those described in the second embodiment. Accordingly, the same reference numerals represent the same components and description thereof will be omitted.

(Manufacturing Method of Third Embodiment)

Referring now to FIGS. 26-42, a method of manufacturing the above-mentioned non-volatile semiconductor storage device according to the third embodiment is described. Here, as in the second embodiment, only a method of manufacturing the selection gate lines on the drain side SGD is described. In addition, as in the second embodiment, since the method of manufacturing the selection gate line on the source side SGS is similar to that of the selection gate line on the drain side SGD, and the methods of manufacturing the word line WL and the memory transistor MTrmn are similar to those conventionally employed, description thereof will be omitted.

Figure 26:
FIG. 26 is a cross-sectional view illustrating a manufacturing process of the non-volatile semiconductor storage device according to the third embodiment of the present invention.

Firstly, as illustrated in FIG. 26, the manufacturing process is advanced to a state where the insulating layer 21 is formed on the word line WL4 at the top layer. That is, in FIG. 26, the process is advanced to a state where a layer corresponding to the memory transistor MTrmn area is formed below the insulating layer 21 (MTrmn indicated by the down-arrow in FIG. 8).

Figure 27:
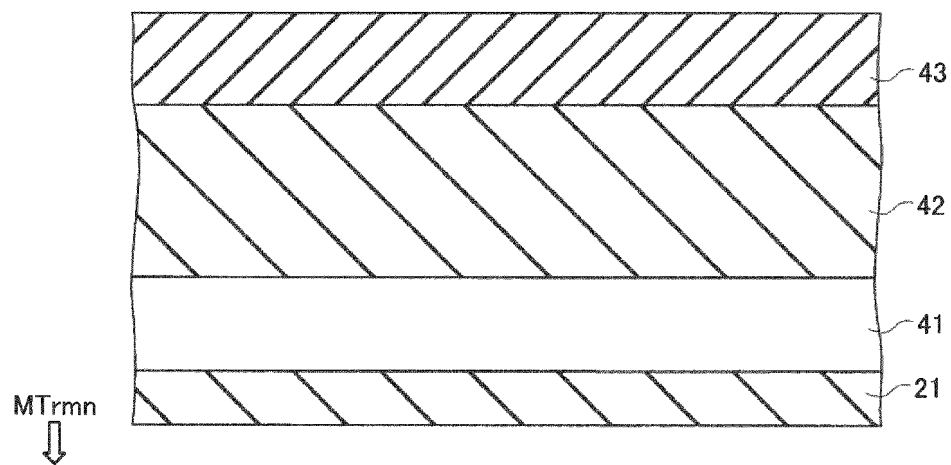
FIG. 27 is a cross-sectional view illustrating a manufacturing process of the non-volatile semiconductor storage device according to the third embodiment of the present invention.

Then, an amorphous silicon layer 41 is deposited on the insulating layer 21 and boron (B) is injected thereto. An oxide film 42 and a silicon nitride (SiN) film 43 are further deposited thereon, which results in the state as illustrated in FIG. 27. The amorphous silicon layer 41 provides the lower selection gate line on the drain side SGDd mentioned above. For example, the amorphous silicon layer 41 has a thickness of 200 nm, the oxide film 42 has a thickness of 300 nm, and the silicon nitride film 43 has a thickness of 150 nm, respectively.

Figure 28:
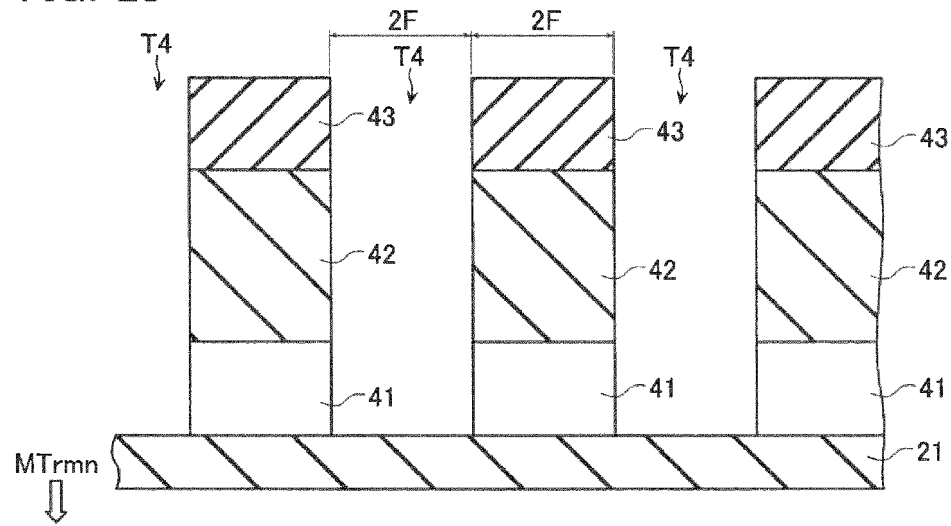
FIG. 28 is a cross-sectional view illustrating a manufacturing process of the non-volatile semiconductor storage device according to the third embodiment of the present invention.

Then, as illustrated in FIG. 28, a lithography process is performed. Resists of mask material are patterned in a stripe form on the silicon nitride film 43, with a width of, and spaced apart by "2 F" (i.e., line and space of "4 F" pitch). Then, Reactive Ion Etching (RIE) is performed to remove parts of the silicon nitride film 43, the oxide film 42, and the amorphous silicon layer 41. Through this process, such trenches T4 are formed that extend from the surfaces of the silicon nitride films 43 to the upper surfaces of the insulating layer 21. At this moment, the amorphous silicon layers 41 have the shape of the lower selection gate line on the drain side SGDd. In this case, for example, "2 F" is 180 nm.

Figure 29:
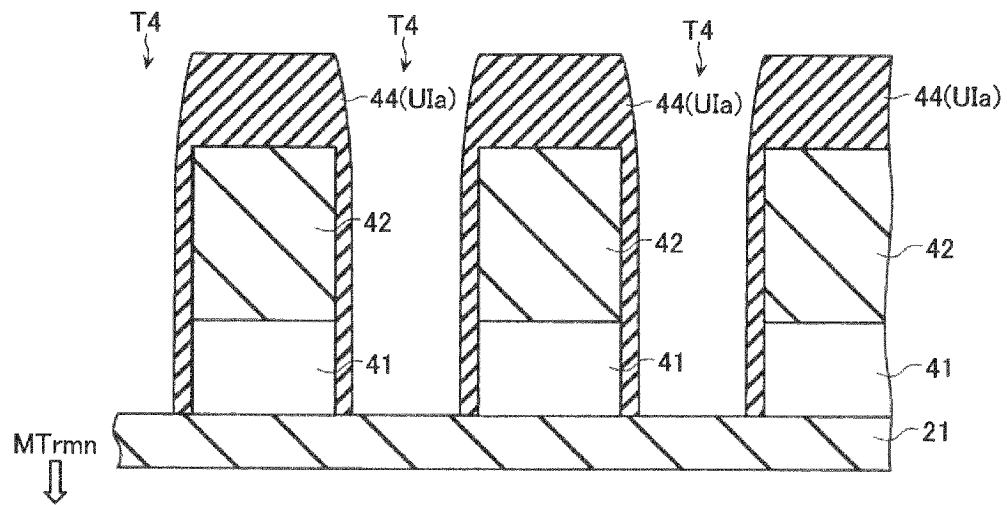
FIG. 29 is a cross-sectional view illustrating a manufacturing process of the non-volatile semiconductor storage device according to the third embodiment of the present invention.

Then, as illustrated in FIG. 29, CVD process is performed to deposit a silicon nitride film 44 on the sidewall of the trench T4 and the surface of the silicon nitride film 43, respectively. The silicon nitride film 43 and the silicon nitride film 44 together form one insulating film UIa as mentioned above. Besides, silicon nitride film 44 deposited on the bottom surface of the trench T4 is removed by etching or the like.

Figure 30:
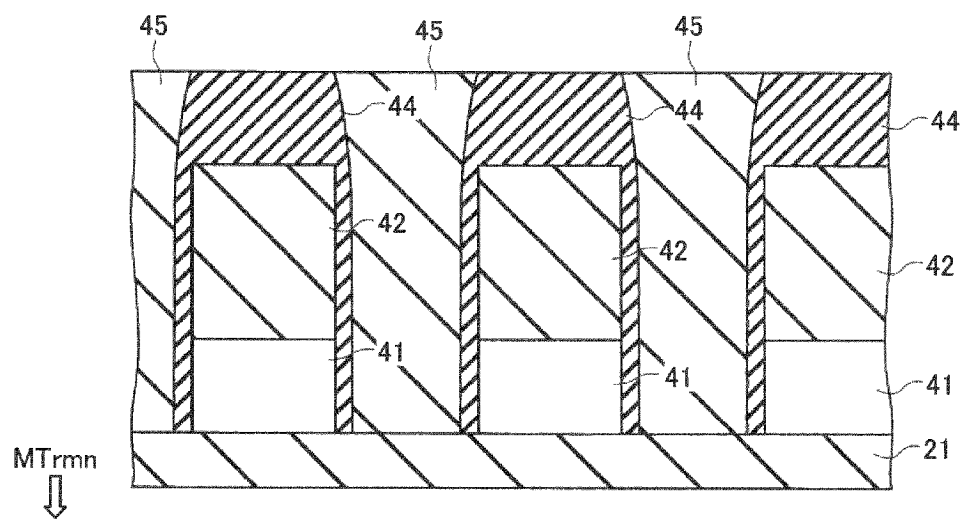
FIG. 30 is a cross-sectional view illustrating a manufacturing process of the non-volatile semiconductor storage device according to the third embodiment of the present invention.

Then, an oxide film 45 is deposited within the trenches T4, which is later flattened by CMP process until a surface is provided at the level of the upper surfaces of the silicon nitride films 44, which results in the state as illustrated in FIG. 30. That is, through the process illustrated in FIG. 30, the trenches T4 are filled with the oxide film 45. The oxide film 45 provides interlayers between the amorphous silicon layers 41 (lower selection gate lines on the drain side SGDd).

Figure 31:
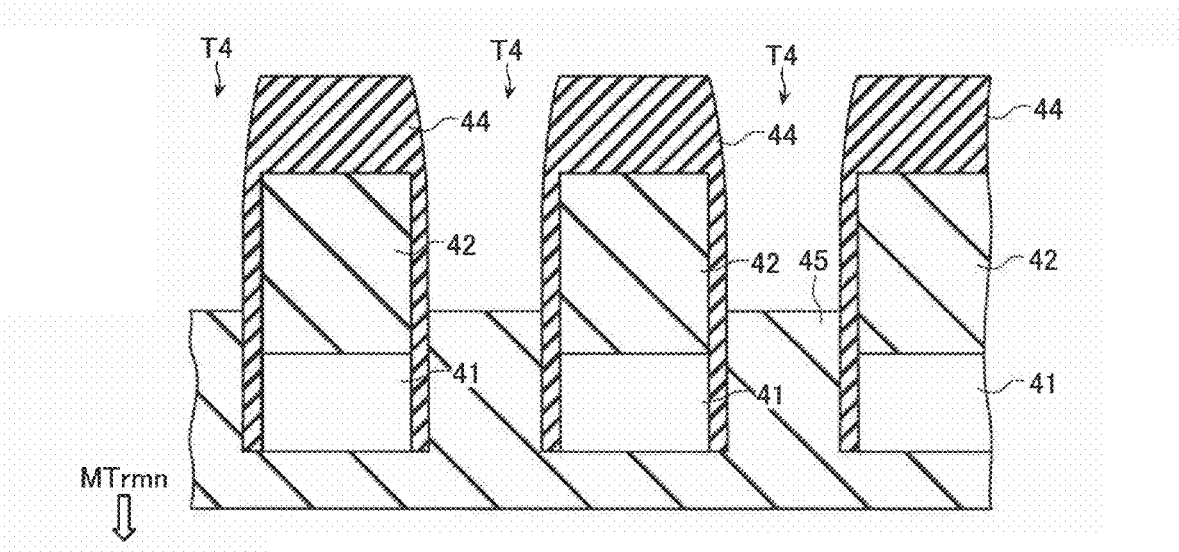
FIG. 31 is a cross-sectional view illustrating a manufacturing process of the non-volatile semiconductor storage device according to the third embodiment of the present invention.

Then, as illustrated in FIG. 31, etch-back process is performed. For example, such a chemical is selected for etching that has a higher selection ratio with respect to the silicon nitride film 44 to remove the oxide film 45 preferentially by etching. In this case, the upper surface of the oxide film 45 in the trench T4 is formed to be higher than that of the amorphous silicon layer 41, and lower than that of the oxide film 42.

Figure 32:
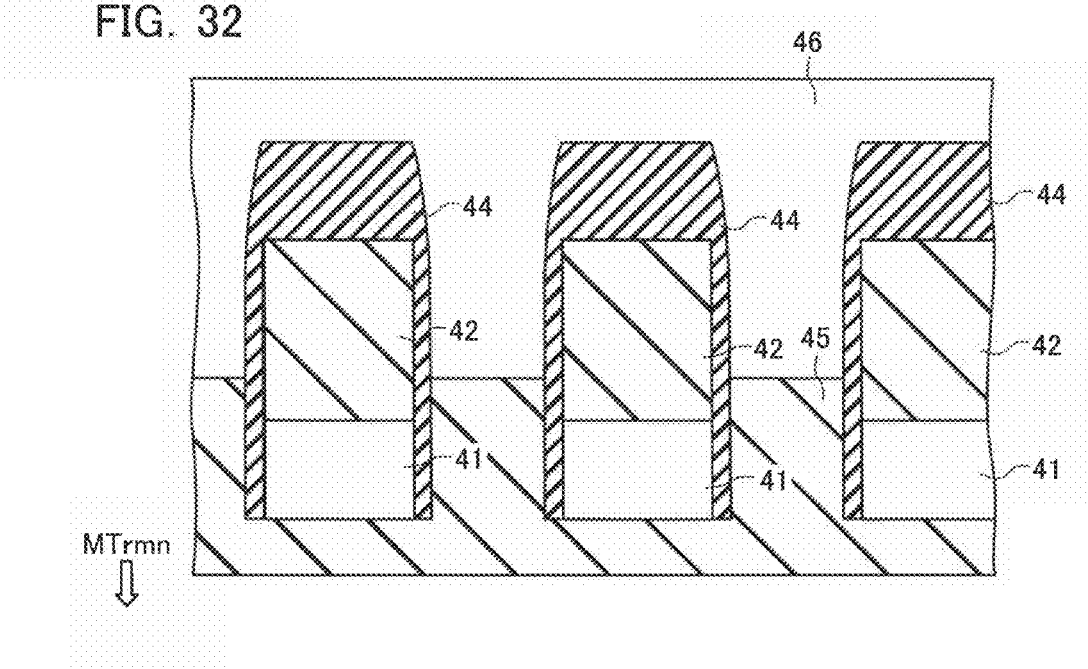
FIG. 32 is a cross-sectional view illustrating a manufacturing process of the non-volatile semiconductor storage device according to the third embodiment; of the present invention

Then, as illustrated in FIG. 32, an amorphous silicon layer 46 is deposited on the silicon nitride film 44 and the oxide film 45 in the trench T4.

Figure 33:
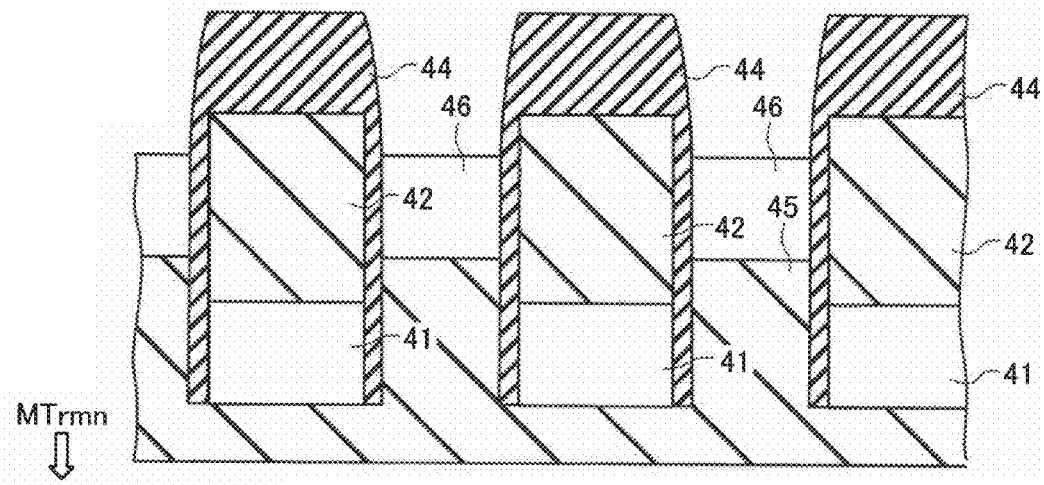
FIG. 33 is a cross-sectional view illustrating a manufacturing process of the non-volatile semiconductor storage device according to the third embodiment of the present invention.

Then, as illustrated in FIG. 33, etch-back process is performed. That is, since the silicon nitride film 44 has a higher selection ratio than the amorphous silicon layer 46, the amorphous silicon layer 46 is preferentially removed by etching. In this case, the upper surface of the amorphous silicon layer 46 in the trench T4 is formed to be lower than that of the oxide film 42. Through the process illustrated in FIG. 33, the amorphous silicon layer 46 provides the upper selection gate line on the drain side SGDu.

Figure 34:
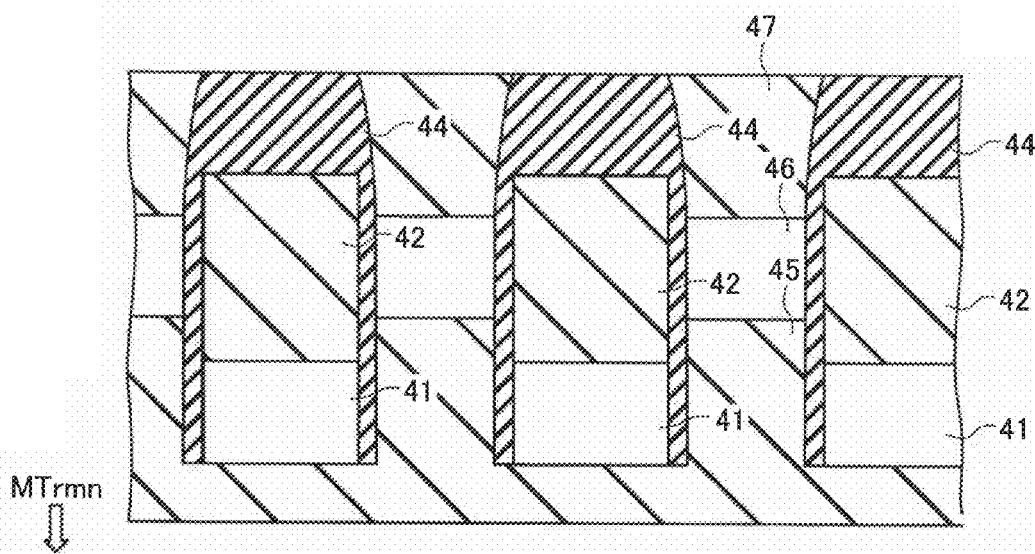
FIG. 34 is a cross-sectional view illustrating a manufacturing process of the non-volatile semiconductor storage device according to the third embodiment of the present invention.

Then, as illustrated in FIG. 34, an oxide film 47 is deposited within the trenches T4, which is later flattened by CMP process until a surface is provided at the level of the upper surfaces of the silicon nitride films 44.

Figure 35:
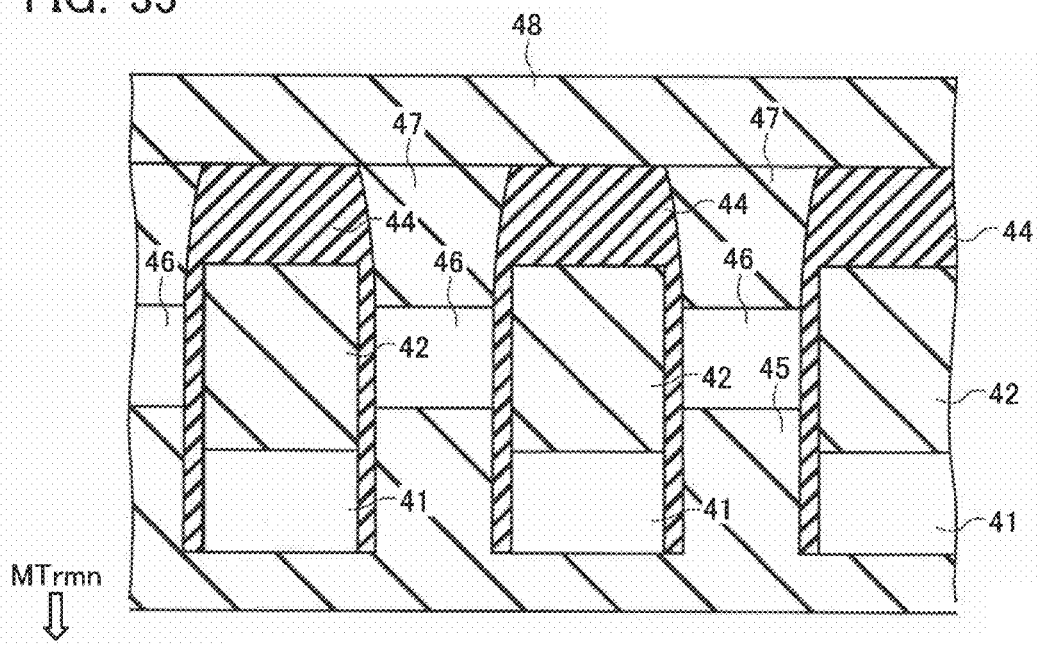
FIG. 35 is a cross-sectional view illustrating a manufacturing process of the non-volatile semiconductor storage device according to the third embodiment of the present invention.

Then, as illustrated in FIG. 35, an oxide film 48 is further deposited on the upper surfaces of the oxide film 47 and the silicon nitride film 44.

Figure 36:
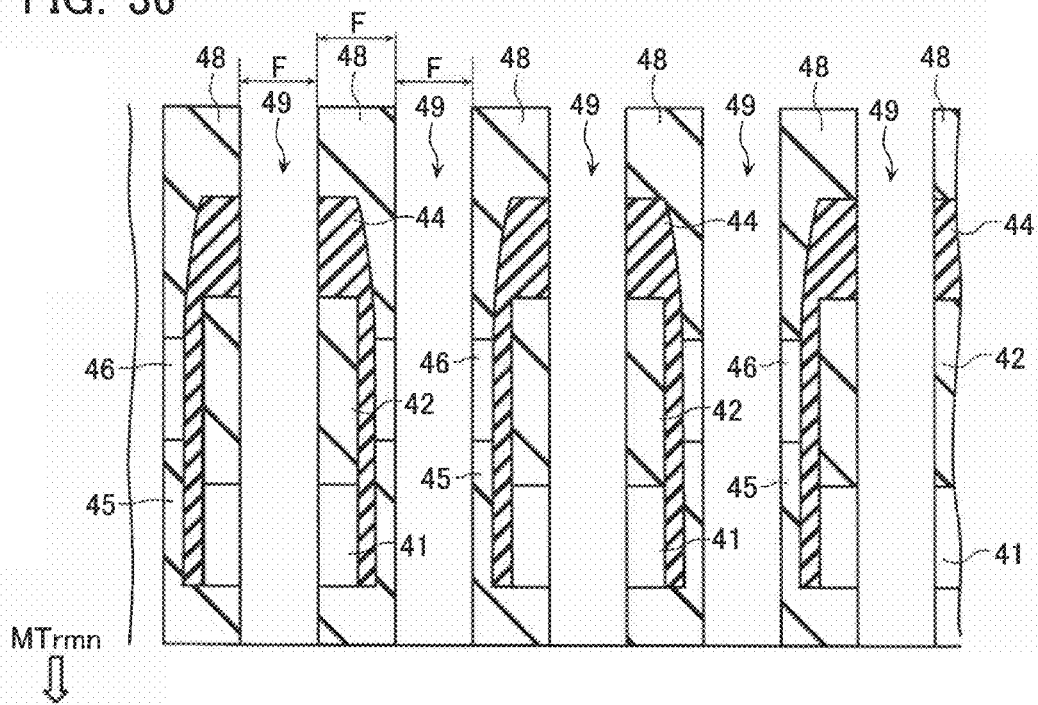
FIG. 36 is a cross-sectional view illustrating a manufacturing process of the non-volatile semiconductor storage device according to the third embodiment of the present invention.

Then, as illustrated in FIG. 36, lithography and RIE processes are performed. Through the lithography and RIE processes, through-holes 49 are formed in a grid form on the oxide film 48, with a width of, and spaced apart by "F". Each of the through-holes 49 is formed so as to pass through the center in the width direction of each of the amorphous silicon layers (lower selection gate lines on the drain side SGDd) 41 as well as the center in the width direction of each of the amorphous silicon layers (upper selection gate lines on the drain side SGDu) 46. Besides, the through-hole 49 is formed to a depth sufficient to reach the corresponding memory transistor MTrmn area. For example, the through-hole 49 has a diameter of 90 nm.

Figure 37:
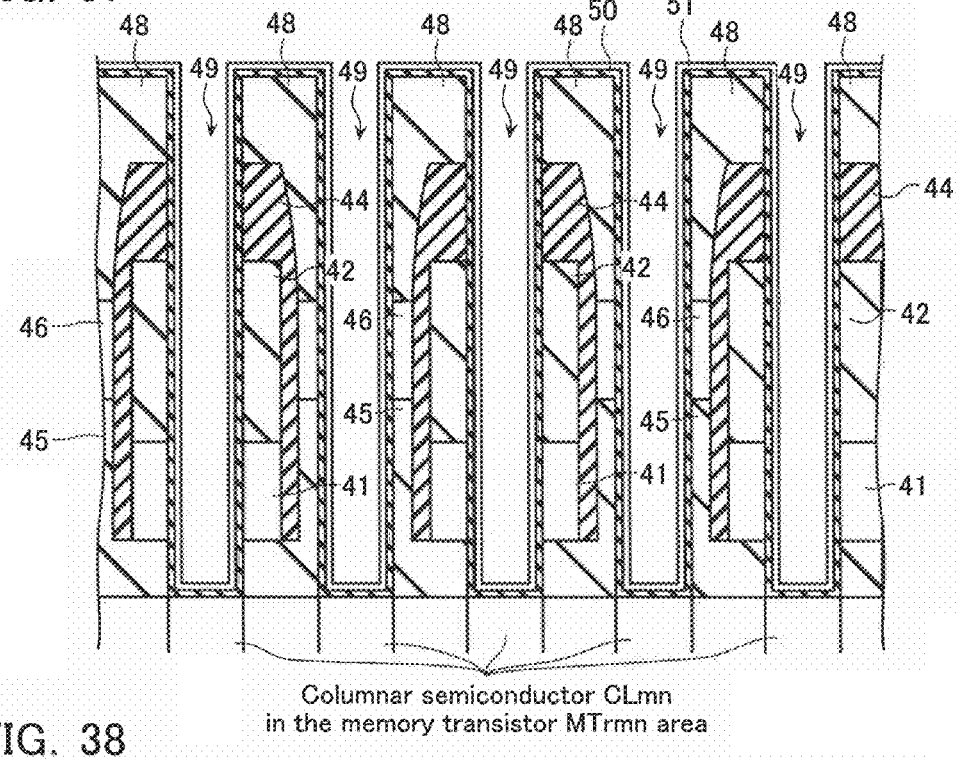
FIG. 37 is a cross-sectional view illustrating a manufacturing process of the non-volatile semiconductor storage device according to the third embodiment of the present invention.

Then, as illustrated in FIG. 37, a gate oxide film 50 and an amorphous silicon layer 51 are formed on the surface of each of the through-hole 49.

Figure 38:
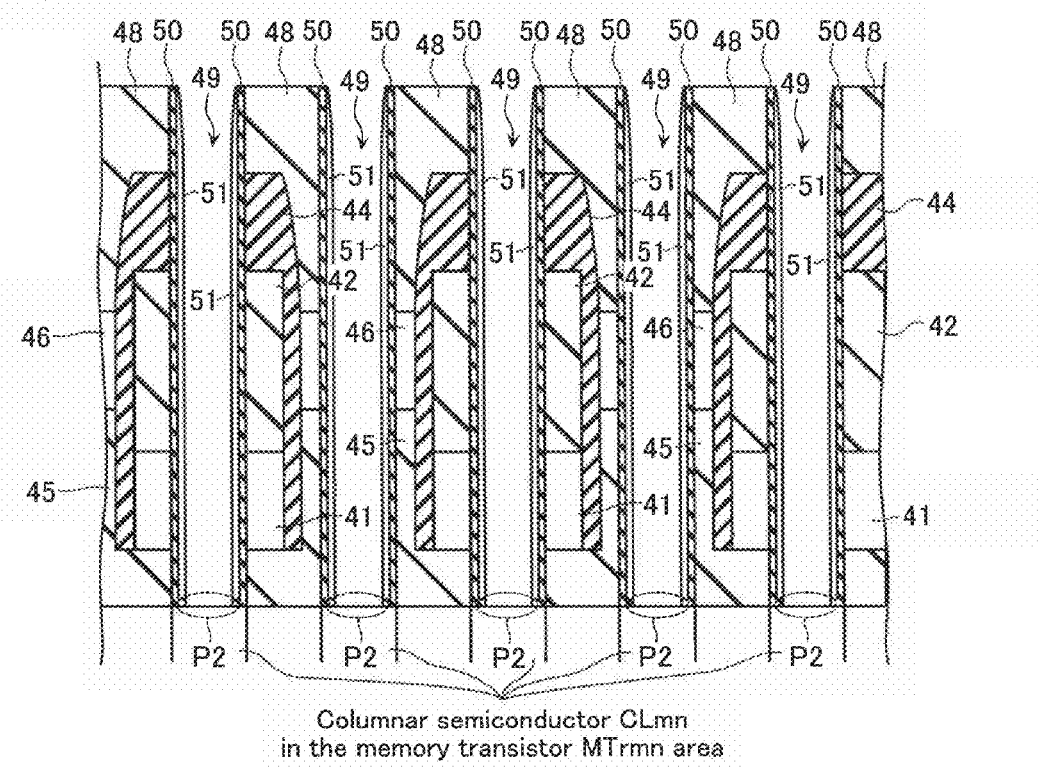
FIG. 38 is a cross-sectional view illustrating a manufacturing process of the non-volatile semiconductor storage device according to the third embodiment of the present invention.

Then, as illustrated in FIG. 38, RIE is performed to remove by etching those portions of the gate oxide films 50 (areas P2 illustrated in FIG. 38) that are formed on the bottom surfaces of the through-holes 49. On the other hand, since those portions of the gate oxide films 50 that are formed on the sidewalls of the through-holes 49 are preserved by corresponding amorphous silicon layers 51 formed thereon, those portions still remains without being removed by etching.

Figure 39:
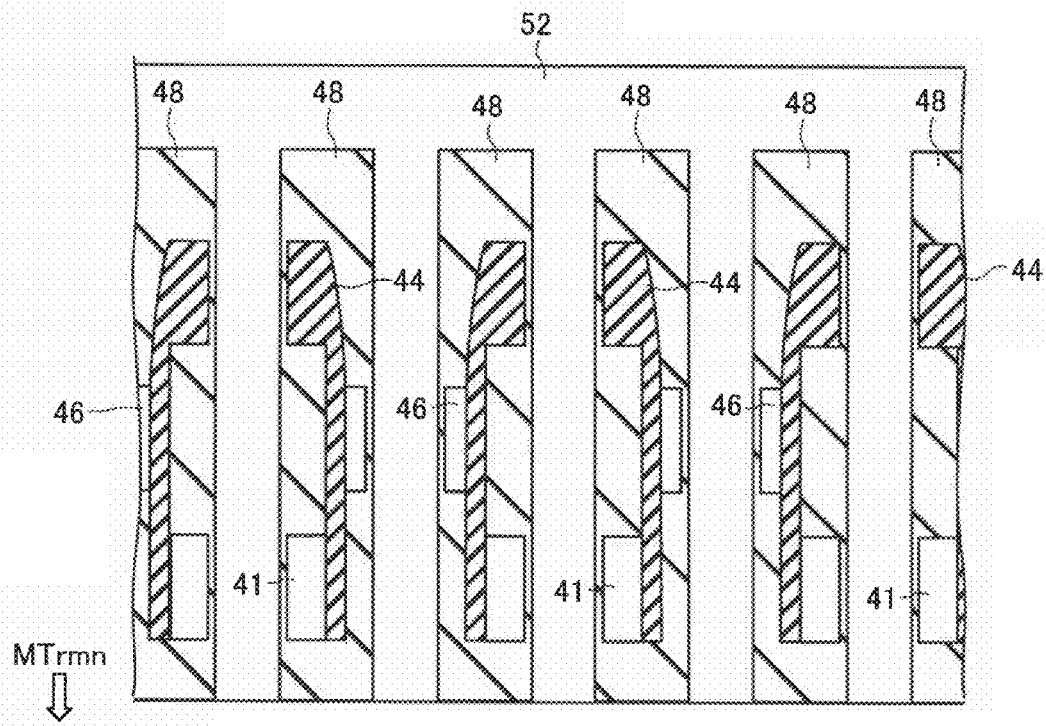
FIG. 39 is a cross-sectional view illustrating a manufacturing process of the non-volatile semiconductor storage device according to the third embodiment of the present invention.

Then, as illustrated in FIG. 39, an amorphous silicon layer 52 is deposited within the through-holes 49. The amorphous silicon layer 52 provides columnar semiconductors CLmn.

Figure 40:
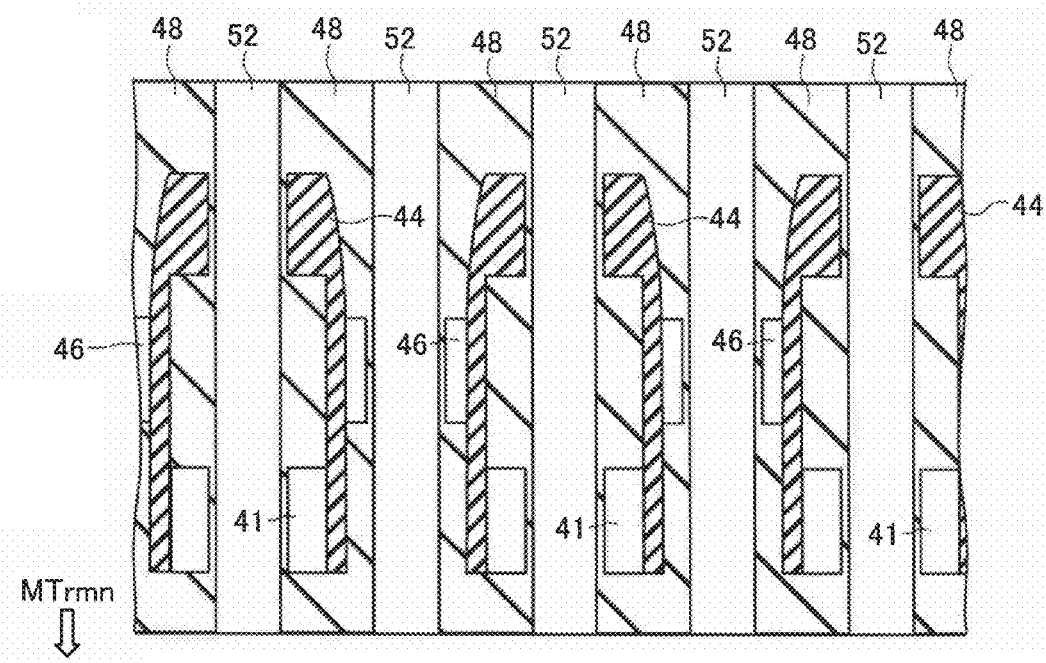
FIG. 40 is a cross-sectional view illustrating a manufacturing process of the non-volatile semiconductor storage device according to the third embodiment of the present invention.

Then, as illustrated in FIG. 40, the amorphous silicon layer 52 is etch-backed so that a surface is provided at the level of the upper surfaces of the oxide films 48.

Figure 41:
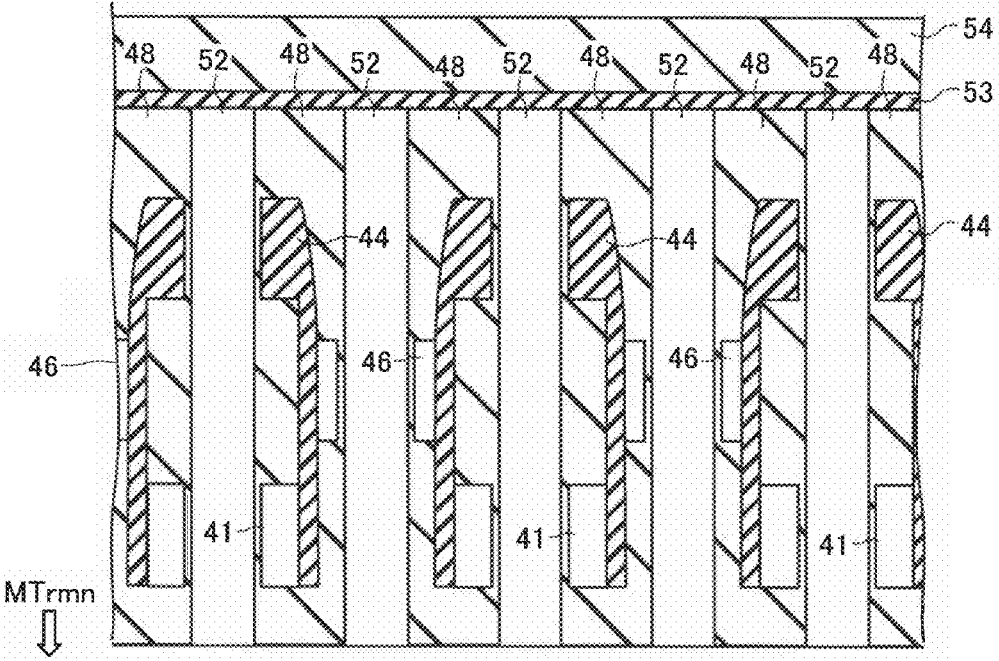
FIG. 41 is a cross-sectional view illustrating a manufacturing process of the non-volatile semiconductor storage device according to the third embodiment of the present invention.

Then, as illustrated in FIG. 41, a silicon nitride film 53 and an oxide film 54 are deposited on the surface of the amorphous silicon layer (columnar semiconductor CLmn) 52 and the oxide film 48. For example, the silicon nitride film 53 has a thickness of 50 nm and the oxide film 54 has a thickness of 200 nm.

Figure 42:
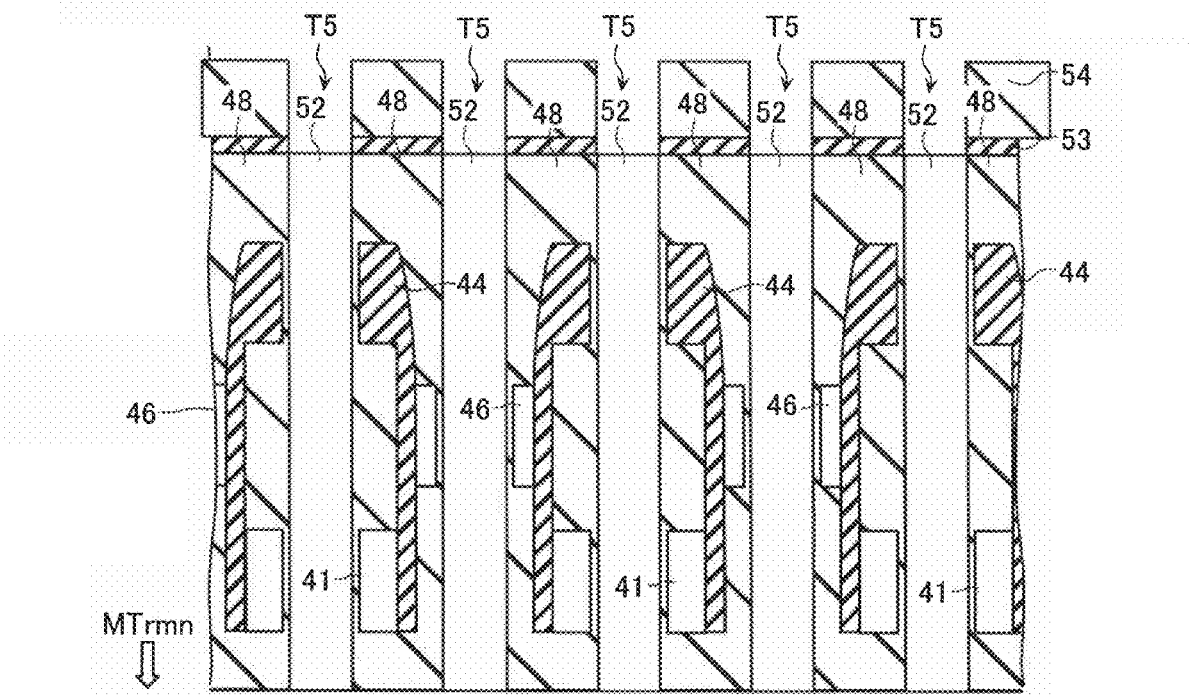
FIG. 42 is a cross-sectional view illustrating a manufacturing process of the non-volatile semiconductor storage device according to the third embodiment of the present invention.

Then, as illustrated in FIG. 42, lithography and RIE processes are performed to remove those portions of the silicon nitride film 53 and the oxide film 54 that are located in correspondence with the amorphous silicon layer (columnar semiconductor CLmn) 52, thereby forming trench T5.

Then, titanium (Ti)/titanium nitride (TiN) 50 is deposited within the trench T5, which is later flattened by CMP process. In this way, the non-volatile semiconductor storage device according to the third embodiment is formed as illustrated in FIG. 25. Besides, the deposited titanium (Ti)/titanium nitride (TiN) 50 provides M0 wirings M0L for connection to the bit line BL.

Since the third embodiment includes upper selection gate lines on the drain (source) side SGDu (SGSu) and lower selection gate line on the drain (source) side SGDd (SGSd), it may provide similar advantages to the first embodiment. In addition, according to the third embodiment as illustrated in FIGS. 32 and 33, upper selection gate line on the drain side SGDu is formed by the silicon nitride film 44 in a self-alignment manner. Accordingly, the third embodiment may be manufactured in a smaller number of lithography steps, reduced by one, in comparison to the first and second embodiments, which may result in lower manufacturing costs.

Fourth Embodiment

Configuration of Fourth Embodiment

Figure 43:
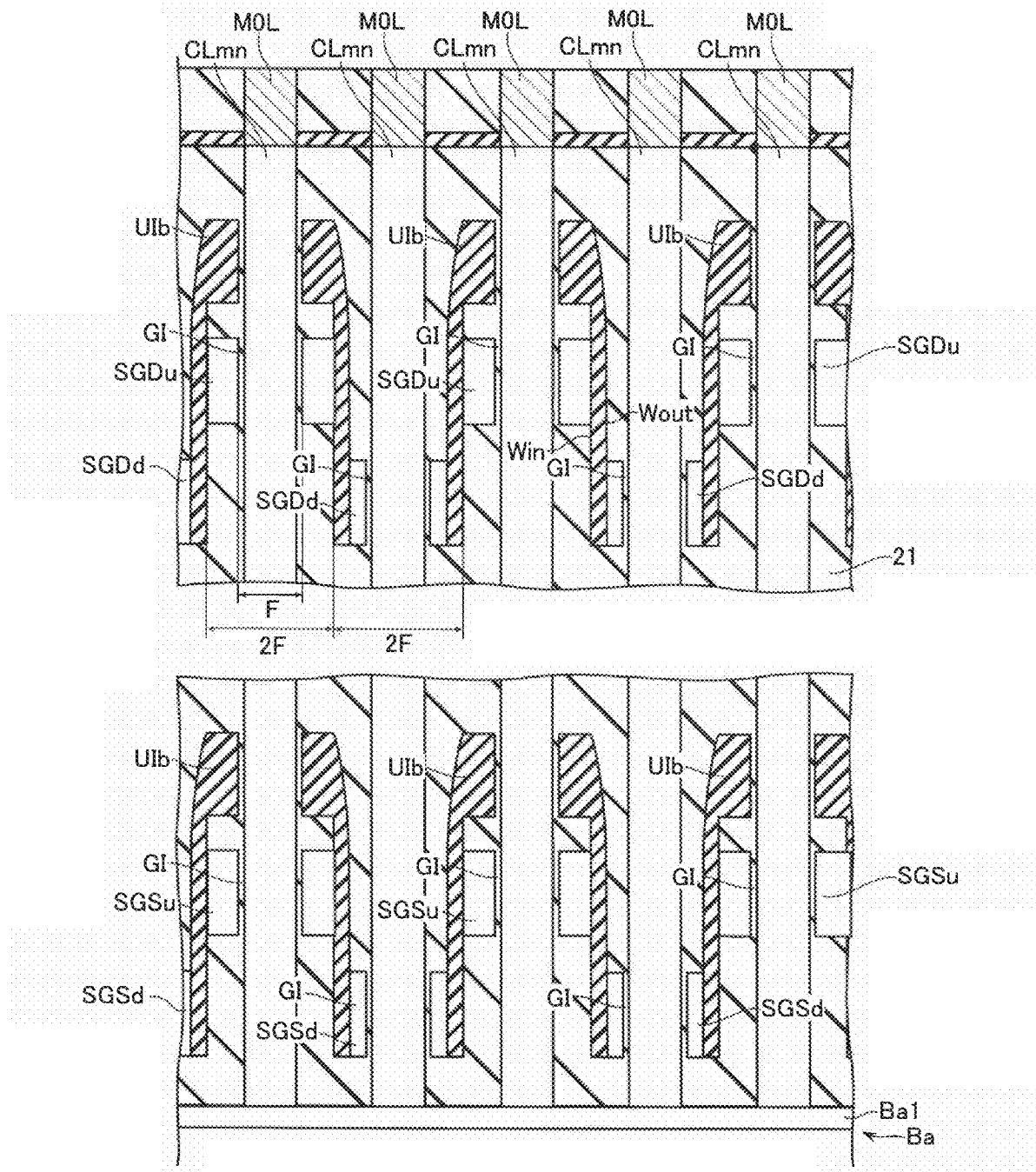
FIG. 43 is a cross-sectional view schematically illustrating a part of the memory transistor area 12 in a non-volatile semiconductor storage device according to a fourth embodiment of the present invention.

Referring now to FIG. 43, a non-volatile semiconductor storage device according to a fourth embodiment of the present invention is described. As illustrated in FIG. 43, the non-volatile semiconductor storage device according to the fourth embodiment has insulating film UIb provided therein to cover upper selection gate line on the drain side SGDu. Besides, the insulating film UIb is not formed to cover the lower selection gate line on the drain side SGDd. Rather, the inner sidewall Win and the outer sidewall Wout of the insulating film UIb are adjacent to the lower selection gate line on the drain side SGDd and the upper selection gate line on the drain side SGDu, respectively. The inner sidewall Win contacts the upper selection gate lines on the drain side SGDu, while the outer sidewall Wout contacts the lower selection gate lines on the drain side SGDd. To this extent, the insulating film UIb in the fourth embodiment is different from the insulating films UI and UIa in the second and third embodiments. Besides, in the fourth embodiment, insulating films UIb similar to the upper selection gate lines on the drain side SGDu are also provided in the area of the upper selection gate lines on the source side SGSu. The other components of the fourth embodiment are the same as those described in the second embodiment. Accordingly, the same reference numerals represent the same components and description thereof will be omitted.

(Manufacturing Method of Fourth Embodiment)

Referring now to FIGS. 44-47, a method of manufacturing the above-mentioned non-volatile semiconductor storage device according to the fourth embodiment is described. FIGS. 44-47 illustrate the manufacturing method according to the fourth embodiment and the subsequent manufacturing steps after that illustrated in FIG. 27 in the manufacturing method according to the third embodiment. Besides, as in the second and third embodiments, the method of manufacturing selection gate line on the source side SGS is similar to that of the selection gate line on the drain side SGD, and the methods of manufacturing the word line WL and the memory transistor MTrmn are to those conventionally employed, description thereof will be omitted.

Figure 44:
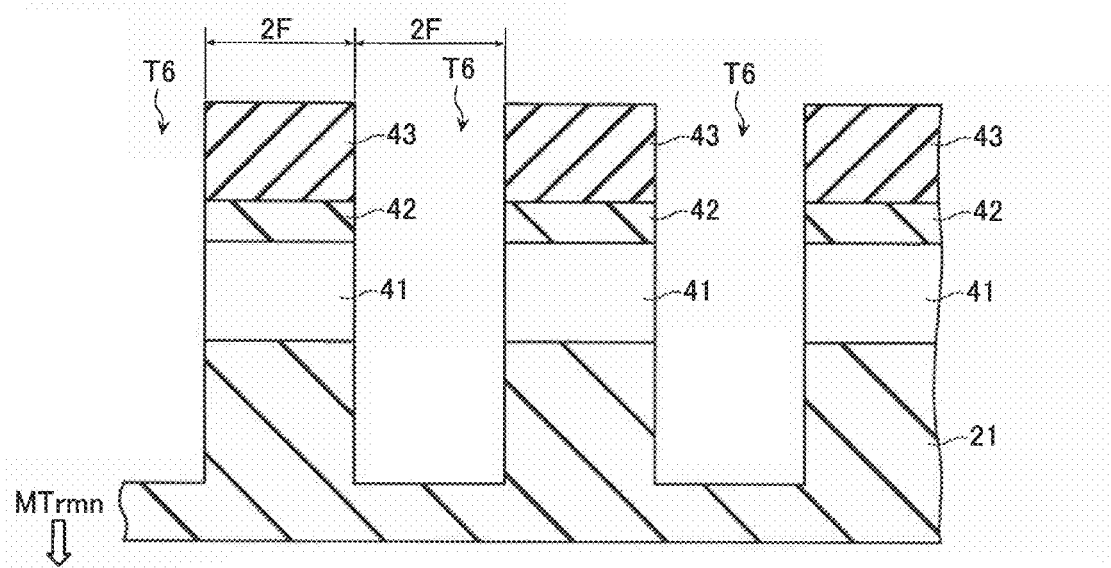
FIG. 44 is a cross-sectional view illustrating a third manufacturing process of the non-volatile semiconductor storage device according to the fourth embodiment of the present invention.

Firstly, as illustrated in FIG. 44, beginning with a state where the amorphous silicon layer 41, the oxide film 42, and the silicon nitride film 43 are deposited on the insulating layer 21 (see FIG. 26), a lithography process is performed. Resists of mask material are patterned in a stripe form on the silicon nitride film 43, with a width of, and spaced apart by "2 F" (i.e., line and space of "4 F" pitch). Then, Reactive Ion Etching (RIE) is performed to remove parts of the silicon nitride film 43, the oxide film 42, the amorphous silicon layer 41, and the insulating layer 21. Through this process, such trenches T6 are formed that extend from the surfaces of the silicon nitride films 43 to a certain depth in the upper surface of the insulating layer 21. At this moment, through this process, the amorphous silicon layers 41 have the shape of the upper selection gate line on the drain side SGDu. In this case, for example, "2 F" is 180 nm.

Figure 45:
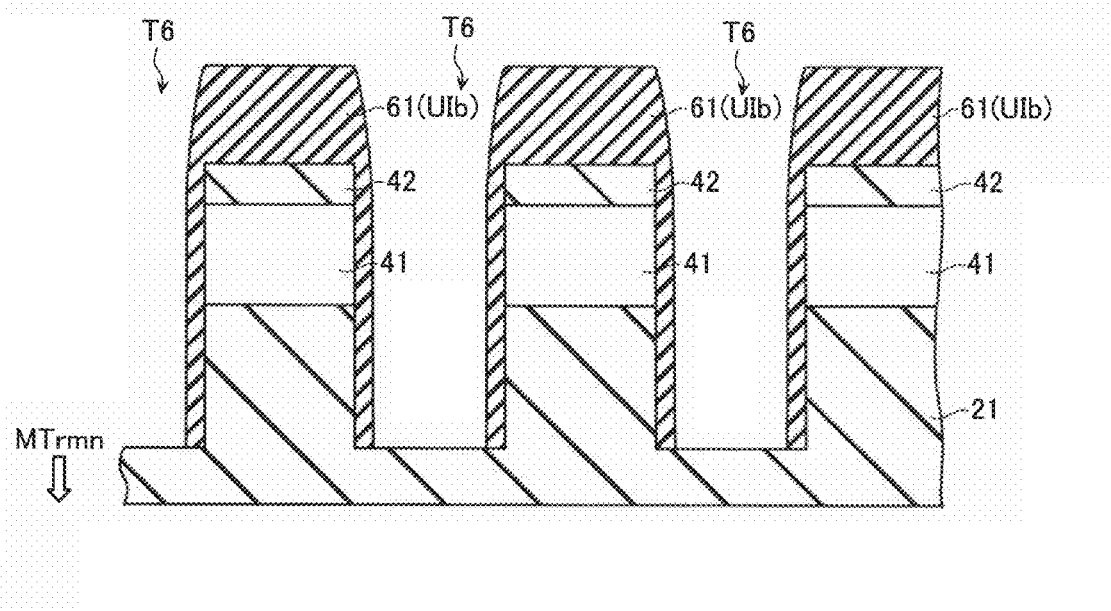
FIG. 45 is a cross-sectional view illustrating a third manufacturing process of the non-volatile semiconductor storage device according to the fourth embodiment of the present invention.

Then, as illustrated in FIG. 45, CVD process is performed to deposit a silicon nitride film 61 on the sidewall of each trench T6 and the surface of the silicon nitride film 43, respectively. The silicon nitride film 43 and the silicon nitride film 61 together form one insulating film UIb as mentioned above.

Figure 46:
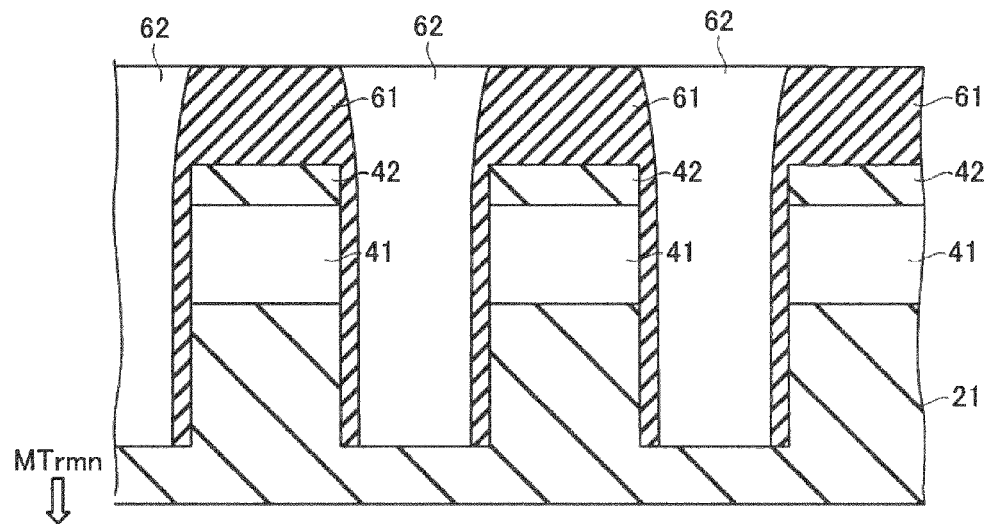
FIG. 46 is a cross-sectional view illustrating a third manufacturing process of the non-volatile semiconductor storage device according to the fourth embodiment of the present invention.

Then, as illustrated in FIG. 46, an amorphous silicon layer 62 is deposited within the trenches T6, which is later flattened by CMP process until a surface is provided at the level of the upper surfaces of the silicon nitride films 61.

Figure 47:
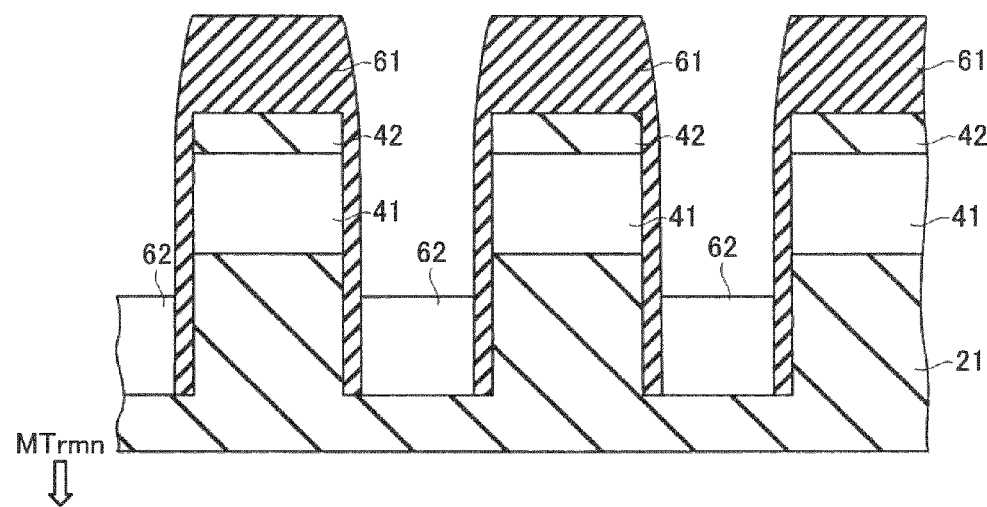
FIG. 47 is a cross-sectional view illustrating a third manufacturing process of the non-volatile semiconductor storage device according to the fourth embodiment of the present invention.

Then, as illustrated in FIG. 47, etch-back process is performed. That is, since the silicon nitride films 61 have a higher selection ratio for wet etching than the amorphous silicon layer 62, the amorphous silicon layer 62 is preferentially removed by etching. In this case, the upper surface of the amorphous silicon layer 62 in the trench T6 is formed to be lower than the lower surface of the amorphous silicon layer 41. The amorphous silicon layer 62 formed through the process illustrated in FIG. 47 serves as the lower selection gate line on the drain side SGDd.

Then, through the manufacturing process similar to that illustrated in FIGS. 26-42 according to the third embodiment, a structure is formed as illustrated in FIG. 43.

Thus, since the fourth embodiment includes upper selection gate lines on the drain (source) side SGDu (SGSu) and lower selection gate lines on the drain (source) side SGDd (SGSd), it may provide similar advantages to the first embodiment. In addition, according to the fourth embodiment, as illustrated in FIGS. 46 and 47, lower selection gate line on the drain side SGDd is formed by the silicon nitride film 61 in a self-alignment manner. Accordingly, the fourth embodiment may be manufactured in a smaller number of lithography steps, reduced by one, in comparison to the first and second embodiments, which may result in lower manufacturing costs.

While embodiments of the present invention have been described with respect to a non-volatile semiconductor storage device, the present invention is not intended to be limited to the embodiments illustrated and described herein. For example, each area of the selection gate lines on the source side SGS may be configured as the third embodiment wherein the interlayer insulating films UIa are provided, and each area of the selection gate lines on the drain side SGD may be configured as the fourth embodiment wherein the interlayer insulating films UIb are provided.

What is claimed is:

1. A non-volatile semiconductor storage device comprising:
   a plurality of memory strings with a plurality of electrically rewritable memory cells connected in series; and
   a plurality of first selection transistors each connected to one end of the respective memory string,
   each of the memory strings including a columnar semiconductor extending in a perpendicular direction with respect to a substrate, a charge accumulation layer formed around the columnar semiconductor via an insulating film, and conductive layers contacting the columnar semiconductor via the insulating film and the charge accumulation layer to configure the memory cells, and
   each of the first selection transistors including a first selection gate line formed around the columnar semiconductor via a first gate insulating film to function as a gate electrode of the first selection transistor,
   the first selection gate lines being arranged at a first height position in the perpendicular direction and at a second height position located higher than the first height position, alternately,
   the first selection gate lines at the first height position being arranged with a first interval with a certain pitch in a direction parallel to the substrate, and
   the first selection gate lines at the second height position being arranged on a first interlayer insulating film residing in the first interval.

2. The non-volatile semiconductor storage device according to claim 1, further comprising:
   a second interlayer insulating film formed to cover at least any one of the first selection gate lines at the first height position and the first selection gate lines at the second height position, wherein
   the second interlayer insulating film has a higher selection ratio than the first interlayer insulating films for a certain etching condition.

3. The non-volatile semiconductor storage device according to claim 1, further comprising:
   further interlayer insulating films formed to cover the conductive layers at upper and side portions thereof, wherein
   an inner sidewall of the further interlayer insulating films contacts the conductive layers, and an outer sidewall of the further interlayer insulating films contacts the first selection gate lines.

4. The non-volatile semiconductor storage device according to claim 1, further comprising
   further interlayer insulating films formed to cover the first selection gate lines at upper and side portions thereof, wherein
   an inner sidewall of the further interlayer insulating films contacts the first selection gate lines, and an outer sidewall of the further interlayer insulating films contacts the conductive layers.

5. The non-volatile semiconductor storage device according to claim 1, further comprising
   a plurality of second selection transistors each connected to other end of the respective memory strings,
   each of the second selection transistors including a second selection gate line formed around the columnar semiconductor via a second gate insulating film to function as a gate electrode of the second selection transistor,
   wherein the second selection gate lines are arranged at a third height position in the perpendicular direction and at a fourth height position located higher than the third height position, alternately,
   wherein the second selection gate lines at the third height position are arranged with a second interval with a certain pitch in a direction parallel to the substrate, and
   wherein the second selection gate lines at the fourth height position are arranged on a fifth interlayer insulating film residing in the second interval.

6. The non-volatile semiconductor storage device according to claim 1, wherein
   the first selection gate lines extend to a direction perpendicular to the longitudinal direction of the columnar semiconductor.

* * * * *